(12) United States Patent
Daibou et al.

(10) Patent No.: US 9,859,491 B2
(45) Date of Patent: Jan. 2, 2018

(54) MAGNETORESISTIVE ELEMENT AND MAGNETIC MEMORY

(71) Applicant: KABUSHIKI KAISHA TOSHIBA, Minato-ku (JP)

(72) Inventors: Tadaomi Daibou, Yokohama (JP); Yushi Kato, Chofu (JP); Shumpei Omine, Meguro (JP); Naoki Hase, Shinagawa (JP); Junichi Ito, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/259,855

(22) Filed: Sep. 8, 2016

(65) Prior Publication Data

US 2016/0380186 A1  Dec. 29, 2016

Related U.S. Application Data

(63) Continuation of application No. PCT/JP2015/050939, filed on Jan. 15, 2015.

(30) Foreign Application Priority Data

Mar. 13, 2014  (JP) ................................. 2014-050839

(51) Int. Cl.
| | | |
|---|---|---|
| *H01L 43/10* | (2006.01) | |
| *H01L 43/08* | (2006.01) | |
| *G11B 5/39* | (2006.01) | |
| *G01R 33/09* | (2006.01) | |
| *H01L 43/02* | (2006.01) | |
| *G11C 11/16* | (2006.01) | |
| *H01L 27/22* | (2006.01) | |

(52) U.S. Cl.
CPC ............. *H01L 43/08* (2013.01); *G01R 33/098* (2013.01); *G11B 5/3909* (2013.01); (Continued)

(58) Field of Classification Search
CPC .......... H01L 43/02; H01L 43/08; H01L 43/10
See application file for complete search history.

(56) References Cited

U.S. PATENT DOCUMENTS

| 7,187,525 B2 | 3/2007 | Shimura et al. |
|---|---|---|
| 8,520,433 B1 | 8/2013 | Kato et al. |

(Continued)

FOREIGN PATENT DOCUMENTS

| JP | 2004-119903 | 4/2004 |
|---|---|---|
| JP | 2009-81314 A | 4/2009 |

(Continued)

OTHER PUBLICATIONS

International Search Report dated Apr. 21, 2015 in PCT/JP2015/050939.

(Continued)

*Primary Examiner* — Allison P Bernstein
(74) *Attorney, Agent, or Firm* — Oblon, McClelland, Maier & Neustadt, L.L.P.

(57) ABSTRACT

A magnetoresistive element according to an embodiment includes a stack structure, the stack structure including: a first magnetic layer containing Mn and at least one element of Ga, Ge, or Al; a second magnetic layer; a first nonmagnetic layer disposed between the first magnetic layer and the second magnetic layer; a third magnetic layer disposed between the first magnetic layer and the first nonmagnetic layer; and a second nonmagnetic layer disposed between the first magnetic layer and the third magnetic layer, the second nonmagnetic layer containing at least one element of Mg, Ba, Ca, C, Sr, Sc, Y, Gd, Tb, Dy, Ce, Ho, Yb, Er, or B.

19 Claims, 13 Drawing Sheets

(52) U.S. Cl.
CPC ............ *G11C 11/161* (2013.01); *H01L 43/02* (2013.01); *H01L 43/10* (2013.01); *G11C 11/16* (2013.01); *H01L 27/228* (2013.01)

(56) References Cited

U.S. PATENT DOCUMENTS

| | | | |
|---|---|---|---|
| 2007/0096229 A1* | 5/2007 | Yoshikawa | G11C 11/16 257/421 |
| 2007/0253120 A1* | 11/2007 | Saito | B82Y 25/00 360/324.11 |
| 2009/0079018 A1 | 3/2009 | Nagase et al. | |
| 2009/0251951 A1 | 10/2009 | Yoshikawa et al. | |
| 2011/0062537 A1 | 3/2011 | Oh et al. | |
| 2012/0088125 A1 | 4/2012 | Nishiyama et al. | |
| 2012/0241881 A1 | 9/2012 | Daibou et al. | |
| 2013/0009260 A1 | 1/2013 | Apalkov et al. | |
| 2013/0249028 A1 | 9/2013 | Kamata et al. | |
| 2014/0119109 A1 | 5/2014 | Nagase et al. | |

FOREIGN PATENT DOCUMENTS

| | | |
|---|---|---|
| JP | 2009-239121 A | 10/2009 |
| JP | 2010-232499 A | 10/2010 |
| JP | 2011-61204 | 3/2011 |
| JP | 2011-119755 A | 6/2011 |
| JP | 2012-204683 A | 10/2012 |
| JP | 2013-16645 A | 1/2013 |
| JP | 2013-21328 A | 1/2013 |
| JP | 2013-197402 A | 9/2013 |
| JP | 2013-197406 | 9/2013 |

OTHER PUBLICATIONS

Takahide Kubota, et al., "Effect of Metallic Mg Insertion on the Magnetoresistance Effect in MgO-based Tunnel Junctions Using $D0_{22}$—$Mn_{3.5}Ga$ Perpendicularly Magnetized Spin Polarizer" Journal of Applied Physics 110, 013915, 2011, pp. 013915-1-013915-5.

Takahide Kubota, et al., "Composition Dependence of Magnetoresistance Effect and Its Annealing Endurance in Tunnel Unctions having Mn-Ga Electrode with High Perpendicular Magnetic Anisotropy" Applied Physics Letters 99, 192509, 2011, pp. 192509-1-192509-3.

T. Kubota, et al., "Magnetic Tunnel Junctions of Perpendicularly Magnetized $L1_0$-MnGa/Fe/MgO/CoFe Structures: Fe-layer-thickness Dependences of Magnetoresistance Effect and Tunnelling Conductance Spectra" Journal of Physics D: Applied Physics 46, 2013, pp. 1-7.

Takahide Kubota, et al., "Dependence of Tunnel Magnetoresistance Effect on Fe Thickness of Perpendicularly Magnetized $L1_{o-Mn62}$ $Ga_{38}$/Fe/MgO/CoFe Junctions" Applied Physics Express 5, 043003, 2012, pp. 043003-1-043003-3.

Takahide Kubota, et al., "Magnetoresistance Effect in Tunnel Junctions with Perpendicularly Magnetized $D0_{22}$-$Mn_{3-o}Ga$ Electrode and MgO Barrier" Applied Physics Express 4, 043002, 2011, pp. 043002-1-043002-3.

Q. L. Ma, et al., "Magnetoresistance Effect in $L1_o$-MnGa/Fe/MgO/CoFeB Perpendicular Magnetic Tunnel Junctions with Co Interlayer" Applied Physics Letters 101, 032402, 2012, pp. 032402-1-032402-4.

T. B. Massalski, "Ba—Ga Phase Diagram" Binary Alloy Phase Diagrams, vol. 1 Ed., 1986, p. 409.

T. B. Massalski, "Ba—Mn Phase Diagram" Binary Alloy Phase Diagrams, vol. 1 Ed., 1986, p. 420.

T. B. Massalski, "Ba—Fe Phase Diagram" Binary Alloy Phase Diagrams, II Ed., vol. 1, 1990, p. 577.

T. B. Massalski, "Assessed Mg—Mn Phase Diagram" Binary Alloy Phase Diagrams, vol. 2 Ed., 1986, p. 1523.

T. B. Massalski, "Assessed Mg—Ga Phase Diagram" Binary Alloy Phase Diagrams, vol. 2 Ed., 1986, p. 1143.

T. B. Massalski, "Calculated Mg—Fe Phase Diagram" Binary Alloy Phase Diagrams, vol. 1 Ed., 1986, p. 1076.

S. Mizukami, et al., "Long-Lived Ultrafast Spin Precession in Manganese Alloys Films with a Large Perpendicular Magnetic Anisotropy" Physical Review Letters 106, 117201, 2011, pp. 117201-1-117201-4.

* cited by examiner

MAGNETORESISTIVE ELEMENT AND MAGNETIC MEMORY

CROSS REFERENCE TO RELATED APPLICATIONS

This application is a continuation of International Application No. PCT/JP2015/050939, filed on Jan. 15, 2015, which is based upon and claims the benefit of priority from the prior Japanese Patent Application No. 2014-050839, filed on Mar. 13, 2014, the entire contents of which are incorporated herein by reference.

FIELD

Embodiments described herein relate generally to magnetoresistive elements and magnetic memories.

BACKGROUND

A magnetic tunnel junction (MTJ) element as a magnetoresistive element has a stack structure formed with a first ferromagnetic layer, a tunnel barrier layer, and a second ferromagnetic layer. Such an MTJ element is known to have a tunneling magnetoresistive (TMR) effect, and is used in a hard disk drive (HDD) head of the 100 Mbpsi (bits per square inch) class or a magnetic random access memory (MRAM).

An MRAM is nonvolatile to store information ("1" or "0") depending on changes in the relative angle between the magnetization directions of the ferromagnetic layers in the MTJ element. As the magnetization switching speed of the ferromagnetic layers is several nanoseconds, high-speed data writing and high-speed data reading can be performed. In view of this, MRAMs are expected to be next-generation high-speed nonvolatile memories. Further, where a technique called spin transfer torque switching is used to control magnetization with a spin polarization current, the cell size in an MRAM can be reduced, and the current density can be increased. Thus, the magnetization of a magnetic layer can be readily switching, and a high-density MRAM that consumes less power can be formed.

Recently, it has been theoretically proved that a magnetoresistance ratio as high as 1000% can be achieved where MgO is used for the tunnel barrier layer, and this has been drawing attention. Specifically, MgO is crystallized so that electrons with a certain wavenumber are selectively tunnel-conducted from a ferromagnetic layer while maintaining the wavenumber. At this point, the spin polarizability in a certain crystal orientation exhibits a large value, and accordingly, a giant magnetoresistive effect is achieved. The increase in the magnetoresistive effect of the MTJ element leads directly to an increase in the density and a decrease in the power consumption in the MRAM.

Meanwhile, to increase the density of a nonvolatile memory, a higher degree of magnetoresistive element integration is essential. However, as the device size becomes smaller, the ferromagnetic layers forming the magnetoresistive elements become poorer in thermal stability. Therefore, the problem lies in how to increase the thermal stability of ferromagnetic materials.

To counter this problem, MRAMs have recently been formed with perpendicular magnetization MTJ elements in which the magnetization directions of the ferromagnetic layers are perpendicular to the film surfaces. In a perpendicular magnetization MTJ element, a material with a high crystal magnetic anisotropy energy is normally used for the ferromagnetic layers. The magnetization of such a material is oriented in a certain crystal direction, and the crystal magnetic anisotropy energy can be controlled by changing the composition ratio between constituent elements and the crystallinities of the constituent elements. That is, the magnetization direction can be controlled by changing the crystal growth direction. Also, a ferromagnetic material has a high crystal magnetic anisotropy energy, and thus, the aspect ratio of the device can be set at 1. Further, a ferromagnetic material has a high thermal stability, and is suitable for integration. In view of these aspects, to achieve higher integration in an MRAM and reduce power consumption, it is important to manufacture perpendicular magnetization MTJ elements having a large magnetoresistive effect.

DETAILED DESCRIPTION

Figure 1:
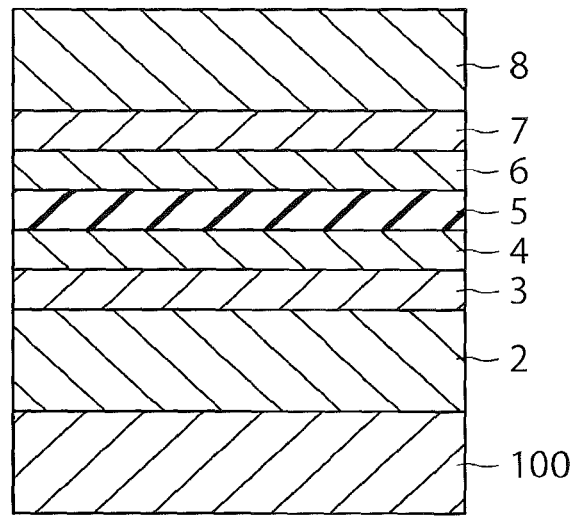
FIG. 1 is a cross-sectional view of a magnetoresistive element according to a first embodiment.

A magnetoresistive element according to an embodiment includes: a stack structure, the stack structure including: a first magnetic layer containing Mn and at least one element of Ga, Ge, or Al; a second magnetic layer; a first nonmagnetic layer disposed between the first magnetic layer and the second magnetic layer; a third magnetic layer disposed between the first magnetic layer and the first nonmagnetic layer; and a second nonmagnetic layer disposed between the first magnetic layer and the third magnetic layer, the second nonmagnetic layer containing at least one element of Mg, Ba, Ca, C, Sr, Sc, Y, Gd, Tb, Dy, Ce, Ho, Yb, Er, or B.

The following is a description of embodiments of the present invention, with reference to the accompanying drawings. In the description below, components with like functions and structures are denoted by like reference numerals, and the same explanation will be repeated only where necessary.

First Embodiment

A magnetoresistive element according to a first embodiment is shown in FIG. 1. FIG. 1 is a cross-sectional view of the magnetoresistive element 1 of the first embodiment. The magnetoresistive element 1 of this embodiment has a structure in which a magnetic layer 2, a nonmagnetic layer 3, an interfacial magnetic layer 4, a nonmagnetic layer 5 (hereinafter also referred to as the tunnel barrier layer 5), an interfacial magnetic layer 6, a nonmagnetic layer 7, and a magnetic layer 8 are stacked in this order on a base layer 100. The resistance value of the magnetoresistive element 1 is determined by the angle between the magnetization directions of the two magnetic layers 2 and 8 having the tunnel barrier layer 5 interposed in between. The angle between the magnetization directions can be controlled with an external magnetic field or the current to be applied to the magnetoresistive element 1. In this process, the two magnetic layers 2 and 8 are made to have different coercive forces or different magnetic anisotropy energies, so that the angle between the magnetization directions can be controlled in a more stable manner. The easy magnetization directions of the magnetic layer 2 and the magnetic layer 8 are perpendicular to the film surfaces.

The magnetoresistive element 1 of this embodiment is a so-called perpendicular magnetization magnetoresistive element in which the magnetization directions of the magnetic layer 2 and the magnetic layer 8 are perpendicular to the respective film surfaces. It should be noted that a film surface means a surface perpendicular to the stacking direction in this specification. An easy magnetization direction is such a direction that the internal energy becomes smallest when the spontaneous magnetization of a macro-sized ferromagnetic material is in the direction without any external magnetic field. On the other hand, a hard magnetization direction is such a direction that the internal energy becomes largest when the spontaneous magnetization of a macro-sized ferromagnetic material is in the direction without any external magnetic field.

The interfacial magnetic layer 6 and the magnetic layer 8 are magnetically coupled to each other via the nonmagnetic layer 7.

For example, in a case where the interfacial magnetic layer 6 and the magnetic layer 8 are ferromagnetically coupled to each other via the nonmagnetic layer 7, the magnetization directions of the interfacial magnetic layer 6 and the magnetic layer 8 are the same. In a case where the interfacial magnetic layer 6 and the magnetic layer 8 are antiferromagnetically coupled to each other via the nonmagnetic layer 7, the magnetization directions of the interfacial magnetic layer 6 and the magnetic layer 8 are the opposite from each other.

The interfacial magnetic layer 4 and the magnetic layer 2 are magnetically coupled to each other, like the interfacial magnetic layer 6 and the magnetic layer 8. That is, the interfacial magnetic layer 4 and the magnetic layer 2 are magnetically coupled to each other via the nonmagnetic layer 3. For example, in a case where the interfacial magnetic layer 4 and the magnetic layer 2 are ferromagnetically coupled to each other via the nonmagnetic layer 3, the magnetization directions of the interfacial magnetic layer 4 and the magnetic layer 2 are the same. In a case where the interfacial magnetic layer 4 and the magnetic layer 2 are antiferromagnetically coupled to each other via the nonmagnetic layer 3, the magnetization directions of the interfacial magnetic layer 4 and the magnetic layer 2 are the opposite from each other.

Where a write current is applied to the MTJ element 1, the magnetization direction of one of the magnetic layers 2 and 8 does not change with the write, and the magnetization direction of the other one of the magnetic layers 2 and 8 changes with the write. The magnetic layer with the invariable magnetization direction is also referred to as the reference layer, and the magnetic layer with the variable magnetization direction is also referred to as the storage layer. In this embodiment, the magnetic layer 2 is the storage layer, and the magnetic layer 8 is the reference layer, for example. The write current is applied between the magnetic layer 2 and the magnetic layer 8, to flow in a direction perpendicular to the film surfaces.

In a case where the magnetic layer 2 is the storage layer, the magnetic layer 8 is the reference layer, and the magnetization direction of the magnetic layer 2 and the magnetization direction of the magnetic layer 8 are antiparallel to each other (the opposite from each other), the write current is made to flow from the magnetic layer 2 toward the magnetic layer 8. In this case, electrons flow from the magnetic layer 8 to the magnetic layer 2 through the nonmagnetic layer 7, the interfacial magnetic layer 6, the nonmagnetic layer 5, and the nonmagnetic layer 3. Electrons that are spin-polarized by passing through the magnetic layer 8 flow into the magnetic layer 2. The spin-polarized electrons that have the spin in the same direction as the magnetization of the magnetic layer 2 pass through the magnetic layer 2, but the spin-polarized electrons that have the spin in the opposite direction from the magnetization of the magnetic layer 2 apply a spin torque to the magnetization of the magnetic layer 2 so that the magnetization direction of the magnetic layer 2 will change to the same direction as the magnetization of the magnetic layer 8. As a result, the magnetization direction of the magnetic layer 2 is reversed, and becomes parallel to (the same as) the magnetization direction of the magnetic layer 8.

In a case where the magnetization direction of the magnetic layer 2 and the magnetization direction of the magnetic layer 8 are parallel to each other, on the other hand, the write current is made to flow from the magnetic layer 8 toward the magnetic layer 2. In this case, electrons flow from the magnetic layer 2 to the magnetic layer 8 through the nonmagnetic layer 3, the interfacial magnetic layer 4, the nonmagnetic layer 5, the interfacial magnetic layer 6, and the nonmagnetic layer 7. Electrons that are spin-polarized by passing through the magnetic layer 2 flow into the magnetic layer 8.

The spin-polarized electrons that have the spin in the same direction as the magnetization of the magnetic layer 8 pass through the magnetic layer 8, but the spin-polarized electrons that have the spin in the opposite direction from the magnetization of the magnetic layer 8 are reflected by the interface with the magnetic layer 8, and flow back into the magnetic layer 2 by following the reverse of the path through which those electrons have first flowed into the magnetic layer 8. As a result, a spin torque is applied to the magnetization of the magnetic layer 2 so that the magnetization direction of the magnetic layer 2 will become the opposite from the magnetization direction of the magnetic layer 8. Consequently, the magnetization direction of the magnetic layer 2 is reversed, and becomes antiparallel to the magnetization direction of the magnetic layer 8.

The resistance value of the magnetoresistive element 1 depends on the relative angle between the magnetization directions of the magnetic layer 2 and the magnetic layer 8, and the value obtained by dividing the result of subtraction of the resistance value in a parallel state from the resistance value in an antiparallel state by the resistance value in the parallel state is called a magnetoresistive change rate.

The magnetic layer 2 is an alloy containing Mn and at least one element selected from the group consisting of Ga, Ge, and Al. For example, MnGa, which is an alloy of Mn and Ga, can have a saturation magnetization amount that varies with its composition. Also, MnGa is a perpendicular magnetization material having a high magnetic anisotropy energy of approximately 10 (Merg/cc). Further, the value of a Gilbert damping constant, which is one of the indices of easiness of magnetization switching, depends on compositions, and has been reported to be approximately 0.008 to 0.015 (see S. Mizukami, F. Wu, A. Sakuma, J. Walowski, D. Watanabe, T. Kubota, X. Zhang, H. Naganuma, M. Oogane, Y. Ando, and T. Miyazaki, "Long-Lived Ultrafast Spin Precession in Manganese Alloys Films with a Large Perpendicular Magnetic Anisotropy", Phys. Rev. Lett. 106, 117201 (2011), for example).

A Gilbert damping constant normally correlates with the size of the spin orbit interaction of the material. A material with a high atomic number tends to have a great spin orbit interaction and a high Gilbert damping constant. Being a material formed with light elements, MnGa has a low Gilbert damping constant. Since only a small energy is required in reversing magnetization, the current density for reversing magnetization with spin-polarized electrons can be greatly lowered.

As described above, MnGa is a perpendicular magnetization material that has a low saturation magnetization, a high magnetic anisotropy energy, and a low Gilbert damping constant. In view of this, MnGa is suitable for the storage layer of a magnetoresistive element.

The magnetic layer 8 is an alloy of Co and Pt, an alloy containing a rare-earth element such as Tb, Dy, Sm, or Gd, and a magnetic element such as Fe, Co, or Ni, or a stack structure (an artificial superlattice) formed with these alloys, for example. Specifically, the magnetic layer 8 is CoPt, TbCo, or TbCoFe, for example. These alloys each have a high magnetic anisotropy energy and a high Gilbert damping constant that is one of the indices of easiness in reversing magnetization, and therefore, are suitable for the reference layer.

A material with a high spin polarizability is used for the interfacial magnetic layer 4 and the interfacial magnetic layer 6. Such a material is a ferromagnetic material containing at least one element selected from the group consisting of Fe, Co, and Ni, for example. Further examples of such materials include FeB, CoB, NiB, FeCoB, and FeCoNiB, which are ferromagnetic materials turned into amorphous materials by the addition of an element such as B, C, or P. An element such as B, C, or P has a smaller atomic radius than Fe, Co, or Ni, which is the base metal of the interfacial magnetic layer 4 and the interfacial magnetic layer 6. Therefore, in a material to which a small amount of the above element is added, the element enters between crystal lattices, and is quickly turned into an amorphous material. A maximum of approximately 25 atomic percent of the above element is added to Fe, Co, or Ni, which is a base metal. In this manner, an amorphous ferromagnetic material can be obtained. As a ferromagnetic material is turned into an amorphous material, an electrode having a surface with high flatness can be expected.

In some cases, a nonmagnetic element such as Al or Cu is added, so as to control the saturation magnetization amount of the interfacial magnetic layer 4 and the interfacial magnetic layer 6. The interfacial magnetic layer 4 maintains its perpendicular magnetization by virtue of the interfacial magnetic anisotropy with the nonmagnetic layer 5, or by virtue of the magnetic coupling to the magnetic layer 2 via the nonmagnetic layer 3. If the thickness of the interfacial magnetic layer 4 increases, the perpendicular magnetization cannot be maintained. The maximum thickness of the interfacial magnetic layer 4 is approximately 2 nm, and therefore, the thickness of the interfacial magnetic layer 4 is preferably smaller than 2.0 nm.

The nonmagnetic layer 3 is interposed between the magnetic layer 2 and the interfacial magnetic layer 4. If an element of the magnetic layer 2 diffuses into the nonmagnetic layer 5, the diffusing element is segregated between the nonmagnetic layer 5 and the interfacial magnetic layer 4, resulting in a decrease in the magnetoresistive change rate of the magnetoresistive element 1. Alternatively, in a case where the magnetic layer 2 is formed with two or more elements, for example, the composition changes by the amount equivalent to the diffusing element, and desired magnetic properties cannot be achieved. A change in the state density leads to an alteration in the electrical conduction properties. Therefore, the nonmagnetic layer 3 is inserted so that element diffusion from the magnetic layer 2 can be prevented.

To increase the TMR ratio of a magnetoresistive element, a crystallization accelerating layer is provided between an amorphous magnetic film such as a CoFeB film adjacent to the tunnel barrier and a perpendicular magnetization film such as an L10-ordered PtFe film, for example. In this manner, the crystalline orientation of the amorphous magnetic film or the CoFeB film is controlled (see JP-A 2011-119755 (KOKAI), for example). However, the TMR ratio is strongly affected not only by the crystalline orientation adjacent to the tunnel barrier but also by diffusion of an element forming the magnetoresistive element. Furthermore, to efficiently reduce element diffusion, it is critical to determine the optimum combination of elements for the magnetic layers forming a magnetoresistive element.

The inventors have achieved a higher TMR by determining the optimum material for the nonmagnetic layer 3 in a magnetoresistive element that includes the magnetic layer 2 formed with an alloy containing Mn and at least one element selected from the group consisting of Ga, Ge, and Al, and the interfacial magnetic layer 4 containing at least one element selected from the group consisting of Fe and Co.

The interfacial magnetic layer 4 maintains its perpendicular magnetization by virtue of the interfacial magnetic anisotropy with the nonmagnetic layer 5, or by virtue of the magnetic coupling to the magnetic layer 2 via the nonmagnetic layer 3. If the thickness of the nonmagnetic layer 3 increases, the magnetic coupling to the interfacial magnetic layer 4 becomes weaker, and therefore, perpendicular magnetization cannot be maintained. The maximum thickness of the nonmagnetic layer 3 that can maintain the magnetic coupling to the interfacial magnetic layer 4 is approximately 2 nm, and therefore, the thickness of the nonmagnetic layer 3 is preferably smaller than 2.0 nm. Particularly, in a case where the magnetic layer 2 is an alloy containing Mn and at least one element selected from the group consisting of Ga, Ge, and Al, the nonmagnetic layer 3 is preferably formed with an element that is not easily solid-solved with Mn, Ga, Ge, and Al. Further, the nonmagnetic layer 3 is preferably not easily solid-solved with Fe and Co, which are the elements constituting the interfacial magnetic layer 4.

A magnetoresistive element is formed with a multi-layer film formed by stacking thin films including a magnetic material, a nonmagnetic material, and an insulator.

In such a multi-layer film, there exist various interfaces, such as an interface between stacked magnetic layers, an interface between a magnetic layer and a base layer, and an interface between a magnetic layer and a tunnel barrier layer. Some combination of elements forms an intermetallic compound in the interface between the elements. In the case of a combination of elements in the phase diagram of all proportional solid solution elements, the elements mix and melt with each other on the atomic level, to turn into a solid phase and form a solid solution. Meanwhile, in the case of a combination of elements in the phase diagram of eutectic or separating elements, the elements repulse each other and do not easily mix with each other, and therefore, formation of a clear interface is expected. In some cases, a method of selecting an optimum combination for artificial superlattice generation is employed so that elements do not mix with each other in a magnetoresistive element. Therefore, a combination of elements in the phase diagram of separating elements is preferable. In the case of a combination of elements that have an interface formed in between and constitute an intermetallic compound, the intermetallic compound is stable, and probably does not diffuse further. In view of the above, a combination of elements in the phase diagram of separating elements, a combination of elements constituting an intermetallic compound, or a combination of elements that has the lowest possibility of forming a solid solution is preferable as the combination of elements that do not easily diffuse between the nonmagnetic layer 3 and the magnetic layer 2, and between the nonmagnetic layer 3 and the interfacial magnetic layer 4. There are binary alloys that have properties like a combination of the above mentioned phase diagrams. A binary alloy formed with certain elements forms a solid solution only in a certain composition domain, for example. Here, a combination of elements that do not easily form a solid solution is defined as a combination in which the total width of the solid-solution composition that appears in the solid solution formation domain in the phase diagram at a predetermined temperature is not greater than 15 atomic percent, even if the elements form a solid solution. This predetermined temperature is a temperature between room temperature and the heating treatment temperature.

The elements that satisfy these conditions are Mg, Ba, Ca, C, Sr, Sc, Y, Gd, Tb, Dy, Ce, Ho, Yb, Er, and B. Therefore, the nonmagnetic layer 3 is preferably an alloy containing at least one element selected from the group consisting of Mg, Ba, Ca, C, Sr, Sc, Y, Gd, Tb, Dy, Ce, Ho, Yb, Er, and B, or a boride, a nitride, or a carbide of the above element, or a stack structure formed with these materials. In other words, the nonmagnetic layer 3 is preferably an alloy containing at least one element of Mg, Ba, Ca, C, Sr, Sc, Y, Gd, Tb, Dy, Ce, Ho, Yb, Er, or B. As used herein, a phrase referring to "at least one of" a list of items refers to any combination of those items, including a single member. As an example, "at least one of: a, b, or c" is intended to cover a, b, c, a-b, a-c, b-c, and a-b-c."

The nonmagnetic layer 7 is interposed between the magnetic layer 8 and the interfacial magnetic layer 6, and has the same functions as the nonmagnetic layer 3.

The nonmagnetic layer 5 is an oxide or a nitride containing at least one element selected from the group consisting of Mg, Al, Ca, Zn, and Ti, for example, or a mixture of the oxide and the nitride. For example, the nonmagnetic layer 5 is MgO, MgAlO, AlCaO, CaZnO, MgZnO, MgAlZnO, or AlN, or a stack structure formed with these materials. This stack structure may be MgO/AlO, MgAlO/MgO, MgAlO/MgO/MgAlO, AlN/AlO, or AlN/MgO, for example. Alternatively, the nonmagnetic layer 5 may be a nonmagnetic metal containing at least one element selected from the group consisting of Cu, Ag, and Au. In a case where the nonmagnetic layer 5 has insulation properties like an oxide or a nitride, an applied current passes through the nonmagnetic layer 5 by virtue of a tunneling effect, and accordingly, the magnetoresistive effect to be achieved is a tunneling magnetoresistive effect (TMR effect). In a case where the nonmagnetic layer 5 is formed with a nonmagnetic metal containing at least one element selected from the group consisting of Cu, Ag, and Au, the current passing through the nonmagnetic layer 5 is ohmically conducted, and accordingly, the magnetoresistive effect to be achieved is a giant magnetoresistive effect (GMR effect).

As described above, the first embodiment can provide a magnetoresistive element that has a perpendicular magnetic anisotropy and is capable of achieving a greater magnetoresistive effect.

Modification

Figure 2:
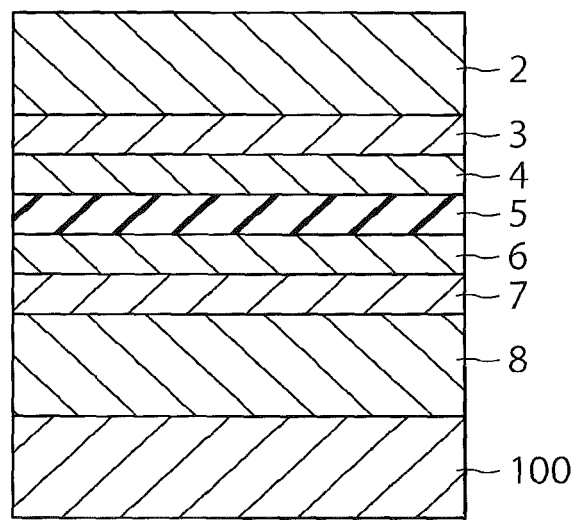
FIG. 2 is a cross-sectional view of a magnetoresistive element according to a modification of the first embodiment.

FIG. 2 shows a magnetoresistive element according to a modification of the first embodiment. In the magnetoresistive element 1A of this modification, the order of stacking the layers on a base layer 100 is the reverse of the order used in the magnetoresistive element 1 of the first embodiment shown in FIG. 1. That is, the magnetoresistive element 1A has a structure in which a magnetic layer 8, a nonmagnetic layer 7, an interfacial magnetic layer 6, a nonmagnetic layer 5, an interfacial magnetic layer 4, a nonmagnetic layer 3, and a magnetic layer 2 are stacked in this order on the base layer 100.

Like the first embodiment, this modification can also provide a magnetoresistive element that has a perpendicular magnetic anisotropy and is capable of achieving a greater magnetoresistive effect.

Second Embodiment

Figure 3:
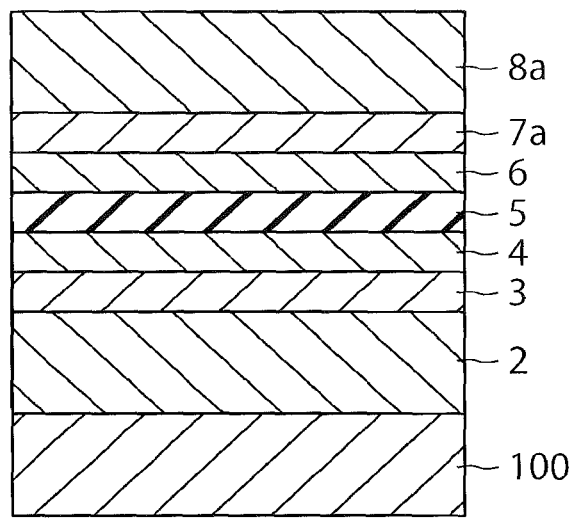
FIG. 3 is a cross-sectional view of a magnetoresistive element according to a second embodiment.

FIG. 3 shows a cross-section of a magnetoresistive element according to a second embodiment. The magnetoresistive element 1B of the second embodiment has the same structure as the magnetoresistive element 1 of the first embodiment shown in FIG. 1, except that the nonmagnetic layer 7 and the magnetic layer 8 are replaced with a nonmagnetic layer 7a and a magnetic layer 8a, respectively. That is, the magnetoresistive element 1B has a structure in which a magnetic layer 2, a nonmagnetic layer 3, an interfacial magnetic layer 4, a nonmagnetic layer 5, an interfacial magnetic layer 6, a nonmagnetic layer 7a, and a magnetic layer 8a are stacked in this order on a base layer 100.

In the second embodiment, materials described in the first embodiment are used for the magnetic layer 2, the nonmagnetic layer 3, the interfacial magnetic layer 4, the nonmagnetic layer 5, and the interfacial magnetic layer 6.

The magnetic layer 8a is an alloy containing Mn and at least one element selected from the group consisting of Ga, Ge, and Al. For example, MnGa, which is an alloy of Mn and Ga, can control the saturation magnetization and the crystal magnetic anisotropy by adjusting the composition thereof, and increase the saturation magnetization and the magnetic anisotropy in a more general manner by reducing the Mn relative to Ga in the composition. In view of this, MnGa alloys with different Mn and Ga compositions are used as the magnetic layer 2 and the magnetic layer 8a, so that the magnetization of one of the magnetic layers can be easily reversed, and the magnetization of the other one of the magnetic layers cannot be easily reversed. Also, an example of the magnetic layer 8a is Mn$_3$Ge, which is an alloy of Mn and Ge.

Mn$_3$Ge is a material that has a high spin polarizability, and also has a high magnetic anisotropy and a low saturation magnetization. As the value of the Gilbert damping constant, which is one of the indices of easiness in magnetization switching, is large, Mn$_3$Ge is suitable for the reference layer. With this structure, magnetization switching with a spin-injection current is enabled.

As in the first embodiment, the nonmagnetic layer 3 and the nonmagnetic layer 7a are preferably formed with elements that is not easily solid-solved with Mn, Ga, Ge, and Al, and with Fe and Co, which form the interfacial magnetic layer 4 and the interfacial magnetic layer 6. Even if the elements is solid-solved with Fe and Co, the solid solution concentration is preferably not higher than 15 atomic percent. Examples of elements that satisfy this condition include Mg, Ba, Ca, C, Sr, Sc, Y, Gd, Tb, Dy, Ce, Ho, Yb, Er, and B. Therefore, the nonmagnetic layer 7a is preferably an alloy containing at least one element selected from the group consisting of Mg, Ba, Ca, C, Sr, Sc, Y, Gd, Tb, Dy, Ce, Ho, Yb, Er, and B, or a boride, a nitride, or a carbide of the above selected element. Alternatively, the nonmagnetic layer 3 and the nonmagnetic layer 7a may be stack structures formed with the boride, the nitride, or the carbide.

Like the first embodiment, the second embodiment can also provide a magnetoresistive element that has a perpendicular magnetic anisotropy and is capable of achieving a greater magnetoresistive effect.

Modification

Figure 4:
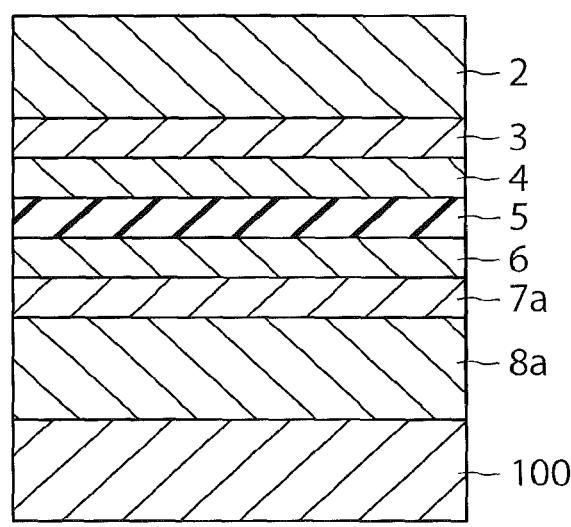
FIG. 4 is a cross-sectional view of a magnetoresistive element according to a modification of the second embodiment.

As shown in FIG. 4, a magnetoresistive element of a modification may have a stack structure in which the stacking order is the reverse of the stacking order used in the magnetoresistive element 1B of the second embodiment. The magnetoresistive element 1C of this modification has a stack structure in which a magnetic layer 8a, a nonmagnetic layer 7a, an interfacial magnetic layer 6, a nonmagnetic layer 5, an interfacial magnetic layer 4, a nonmagnetic layer 3, and a magnetic layer 2 are stacked in this order on a base layer 100.

This modification can also provide a magnetoresistive element that has a perpendicular magnetic anisotropy and is capable of achieving a greater magnetoresistive effect.

Third Embodiment

Figure 5:
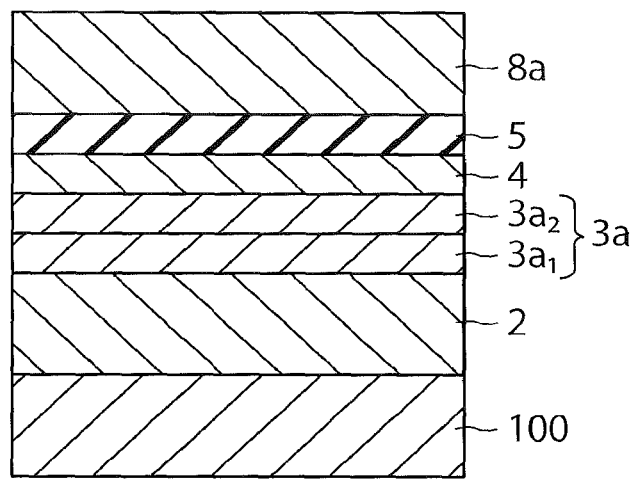
FIG. 5 is a cross-sectional view of a magnetoresistive element according to a third embodiment.

FIG. 5 shows a cross-section of a magnetoresistive element according to a third embodiment. The magnetoresistive element 1D of the third embodiment has a structure in which a magnetic layer 2, a nonmagnetic layer 3a, an interfacial magnetic layer 4, a nonmagnetic layer 5, and a magnetic layer 8a are stacked in this order on a base layer 100. The nonmagnetic layer 3a has a structure formed by stacking a nonmagnetic film 3$a_1$ and a nonmagnetic film 3$a_2$ in this order on the magnetic layer 2.

The magnetic layer 2 and the magnetic layer 8a are alloys each containing Mn and at least one element selected from the group consisting of Ga, Ge, and Al, for example.

The nonmagnetic film 3$a_1$ preferably has a function to reduce element diffusion from the magnetic layer 2. Therefore, the nonmagnetic film 3$a_1$ is preferably formed with an element that is not easily solid-solved with Mn, Ga, Ge, and Al. Even if the element is solid-solved with Mn, Ga, Ge, and Al, the solid solution concentration is preferably not higher than 15 atomic percent. Examples of elements that satisfy this condition include Mg, Ba, Ca, Sr, Sc, Y, Gd, Tb, Dy, Ce, Ho, Yb, Er, and B. Therefore, the nonmagnetic film 3$a_1$ is preferably an alloy containing at least one element selected from the group consisting of Mg, Ba, Ca, Sr, Sc, Y, Gd, Tb, Dy, Ce, Ho, Yb, Er, and B, or a boride, a nitride, or a carbide of the above element.

Alternatively, the nonmagnetic film 3$a_1$ is preferably a stack structure formed with the boride, the nitride, or the carbide.

The nonmagnetic film 3$a_2$ preferably has a function to control the crystalline orientation of the interfacial magnetic layer 4. The nonmagnetic film 3$a_2$ is an alloy that is as thin as 0.3 nm or less, for example, and contains at least one element selected from the group consisting of Ta, Ti, W, Nb, V, Cr, and Hf, or a nitride or a boride of one of these elements. As the nonmagnetic film 3$a_2$ is provided, the B element contained in the interfacial magnetic layer 4 formed with FeB, for example, is absorbed by the nonmagnetic film 3$a_2$. As a result, crystallization of the FeB in the interfacial magnetic layer 4 is facilitated preferentially at the side of the interface with the nonmagnetic layer 5 formed with MgO, for example. Consequently, the nonmagnetic layer 5 formed with MgO and the interfacial magnetic layer 4 formed with FeB can form an interface with little mismatch. Since a clean interface has little dislocation and fewer lattice defects, the tunneling current is not easily affected by electron scattering, and a high TMR can be achieved.

A material with a high spin polarizability is used as the interfacial magnetic layer 4, as in the first embodiment.

Like the first embodiment, the third embodiment can also provide a magnetoresistive element that has a perpendicular magnetic anisotropy and is capable of achieving a greater magnetoresistive effect.

Modification

Figure 6:
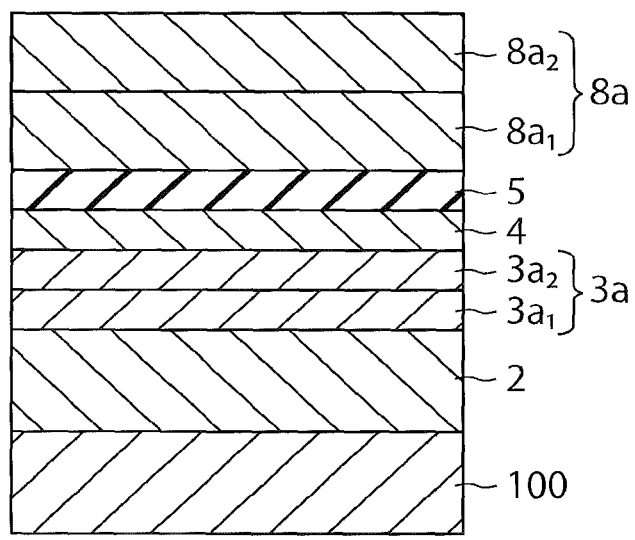
FIG. 6 is a cross-sectional view of a magnetoresistive element according to a modification of the third embodiment.

FIG. 6 shows a cross-section of a magnetoresistive element according to a modification of the third embodiment. The magnetoresistive element 1E of this modification has the same structure as the magnetoresistive element 1D of the third embodiment shown in FIG. 5, except that the magnetic layer 8a is replaced with a stack structure formed with a magnetic film 8$a_1$ and a magnetic film 8$a_2$. The magnetic film 8$a_1$ is formed on the nonmagnetic layer 5, and the magnetic film 8$a_2$ is formed on the magnetic film 8$a_1$. For example, Mn$_3$Ge expected to have a high spin polarizability is used as the magnetic film 8$a_1$. A tunneling magnetoresistive effect depends on the spin polarizability of the ferromagnetic material adjacent to the tunnel barrier. In view of this, a high magnetoresistance ratio can be achieved where the nonmagnetic layer 5 and the magnetic film 8$a_1$ formed with Mn$_3$Ge are adjacent to each other. Meanwhile, MnGa having a high magnetic anisotropy is used as the magnetic film 8$a_2$. As a stack structure formed with the magnetic film 8$a_1$ and the magnetic film 8$a_2$ is used as the magnetic film 8a in this modification, a perpendicular magnetization layer with a high spin polarizability can be obtained.

Like the first embodiment, this modification can also provide a magnetoresistive element that has a perpendicular magnetic anisotropy and is capable of achieving a greater magnetoresistive effect.

In the third embodiment and the modification thereof, each magnetoresistive element may be a stack structure in which the stacking order of the respective layers formed on the base layer 100 is reversed, as in the modifications of the first and second embodiments.

Fourth Embodiment

Figure 7:
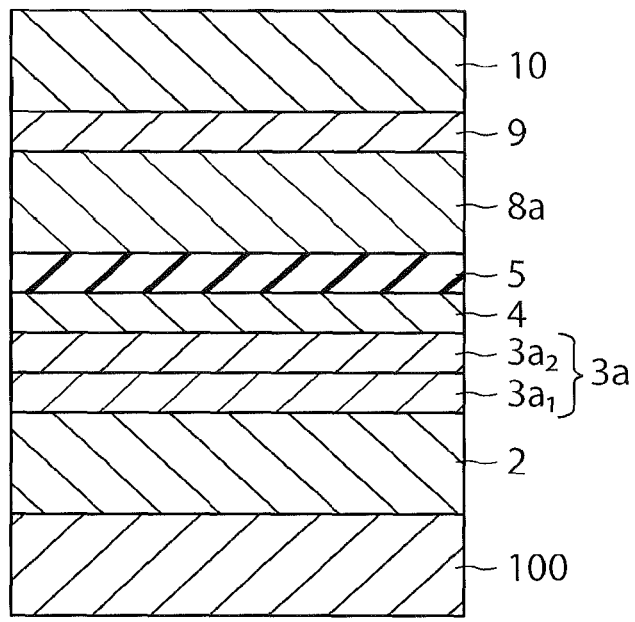
FIG. 7 is a cross-sectional view of a magnetoresistive element according to a fourth embodiment.

FIG. 7 shows a cross-section of a magnetoresistive element according to a fourth embodiment. The magnetoresistive element 1F of the fourth embodiment has the same structure as the magnetoresistive element 1D of the third embodiment shown in FIG. 5, except for further including a nonmagnetic layer 9 formed on the magnetic layer 8a and a magnetic layer 10 formed on the nonmagnetic layer 9. The magnetic layer 10 is also called the bias layer. With this bias layer 10, shifting of the inversion current in the storage layer formed with the magnetic layer 2, the nonmagnetic layer 3a, and the interfacial magnetic layer 4 due to a leakage field from the magnetic layer 8 serving as the reference layer can be reduced and adjusted.

The nonmagnetic layer 9 preferably has a heat resistance so that the magnetic layer 8a and the magnetic layer 10 will not mix with each other during a heating process, and also has a function to control the crystalline orientation at the time of the formation of the magnetic layer 10. If the thickness of the nonmagnetic layer 9 increases, the distance between the magnetic layer 10 and the magnetic layer 2 serving as the storage layer becomes longer. As a result, the shift adjusting field to be applied from the magnetic layer 10 to the storage layer becomes smaller. In view of this, the thickness of the nonmagnetic layer 9 is preferably not greater than 5 nm.

The magnetic layer 10 is formed with a ferromagnetic material having the axis of easy magnetization in a direction perpendicular to the film surface. Since the magnetic layer 10 is located further away from the storage layer than the reference layer is, the thickness of the magnetic layer 10 or the size of the saturation magnetization of the magnetic layer 10 needs to be controlled so that the leak field to be applied to the storage layer is adjusted and made greater than the leak field of the reference layer by the magnetic layer 10. According to a result of a study made by the inventors, the relational expression shown below needs to be satisfied, where $t_2$ and $Ms_2$ represent the thickness and the saturation magnetization of the reference layer, and $t_{22}$ and $Ms_{22}$ represent the thickness and the saturation magnetization of the magnetic layer 10:

$$Ms_2 \times t_2 < Ms_{22} \times t_{22}$$

Like the third embodiment, the fourth embodiment can also provide a magnetoresistive element that has a perpendicular magnetic anisotropy and is capable of achieving a greater magnetoresistive effect.

The magnetic layer 10 serving as a bias layer can also be used in the magnetoresistive elements 1D and 1E of the third embodiment and its modification shown in FIG. 6, and in any of the magnetoresistive elements 1, 1B, and 1C of the first and second embodiments.

Modification

Figure 8:
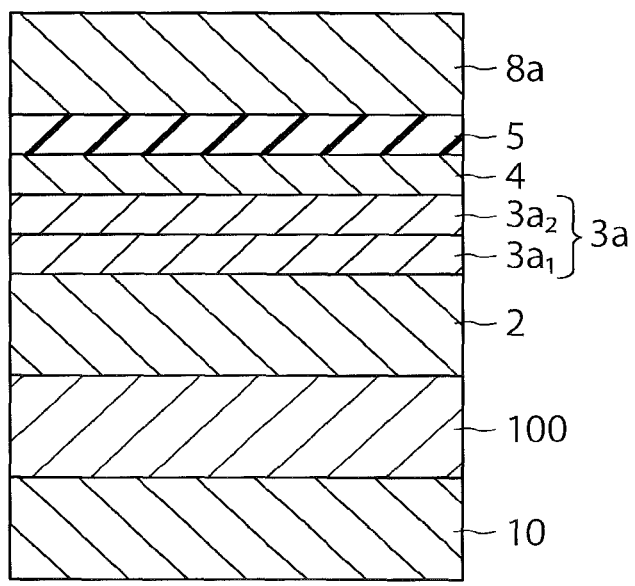
FIG. 8 is a cross-sectional view of a magnetoresistive element according to a modification of the fourth embodiment.

As shown in FIG. 8, in a magnetoresistive element 1G according to a modification of the fourth embodiment, the nonmagnetic layer 9 may be eliminated, and the magnetic layer 10 may be provided on the surface of the base layer 100 on the opposite side from the magnetic layer 2.

Like the fourth embodiment, this modification can also provide a magnetoresistive element that has a perpendicular magnetic anisotropy and is capable of achieving a greater magnetoresistive effect.

Next, the specific structures of the respective layers in the magnetoresistive elements of the above described first through fourth embodiments are described in the following order: the base layer 100, the magnetic layer 8, the interfacial magnetic layer 4, the interfacial magnetic layer 6, the nonmagnetic layer 5, and the nonmagnetic layer 3.

(Base Layer 100)

The base layer 100 is used to control the crystal properties such as the crystalline orientations and the crystal particle sizes of the magnetic layer 2 and the layers above the magnetic layer 2. Therefore, it is important to select a suitable material for the base layer 100. The material and the structure of the base layer 100 are described below.

First, in an example case where an $Mn_3Ga$ alloy is used as the magnetic layer 2, a preferred base layer 100 is as follows. An ordered alloy of $Mn_3Ga$ is a crystalline structure that is called a $DO_{22}$ structure under the Strukturbericht notation system. This is a tetragonal material in which the lattice extends in the c-axis direction, and the lattice constant in the a-axis and b-axis directions is appropriately 3.90 angstroms. An ordered alloy containing Mn and at least one element selected from the group consisting of Ga, Ge, and Al, such as MnGa, $Mn_3Ge$, MnAl, or MnGaAl, which has an $L1_0$ structure, has a lattice constant of approximately 3.9 angstroms in the a-axis direction. The lattice constant in the c-axis direction is 7.12 angstroms.

A first example of the base layer 100 is (001)-oriented, and preferably has a small value in lattice mismatch. The lattice mismatch is defined by the following expression: $(a(Mn_3Ga) - a(\text{foundation material}))/a(\text{foundation material}) \times 100$ Here, $a(Mn_3Ga)$ and $a(\text{foundation material})$ represent the respective lattice constants of $Mn_3Ga$ and the foundation material in the in-plane direction. The lattice mismatch is preferably small. Examples of materials that have lattice mismatch of 4% or lower with $Mn_3Ga$ include (001)-oriented Fe, an FeCo alloy, and Cr. The lattice constant of Fe is approximately 2.87 angstroms. With respect to the base layer formed with Fe, $Mn_3Ga$ can be made to rotate 45 degrees in the in-plane direction and epitaxially grow. At this point, the lattice constant of Fe is lattice-matched at a √2-fold value, and accordingly, the lattice mismatch between $Mn_3Ga$ and Fe is as small as −3.9%.

Likewise, an FeCo alloy depends on compositions. However, its lattice constant is 2.87 angstroms or lower, and accordingly, the lattice mismatch between the FeCo alloy and $Mn_3Ga$ is approximately −3.9%. Cr also has a similar lattice constant, and the lattice mismatch between Cr and $Mn_3Ga$ is as small as −3.9%.

In view of the above, each of the above materials, or a material containing at least one element selected from the group consisting of Fe, Co, and Cr is suitable as the base layer for $Mn_3Ga$.

A second example of the base layer 100 is $MgAl_2O_4$ having a (001)-oriented spinel structure. The lattice constant of $MgAl_2O_4$ in the a-axis direction is approximately 8.09 angstroms. This is almost double the lattice constant of $Mn_3Ga$. Where the basic unit is two unit lattices of $Mn_3Ga$, $Mn_3Ga$ can epitaxially grow on $MgAl_2O_4$ with a small lattice misfit. In this case, the lattice mismatch with $Mn_3Ga$ is approximately −3.6%.

Meanwhile, the lattice constant can be adjusted by controlling the composition of Mg and Al. Therefore, a spinel structure is not necessary, and an oxide containing Mg, Al, and O can be used.

A third example of the base layer 100 is a (001)-oriented perovskite conductive oxide formed with $ABO_3$. Here, the site A contains at least one element selected from the group consisting of Sr, Ce, Dy, La, K, Ca, Na, Pb, and Ba, and the site B contains at least one element selected from the group consisting of Ti, V, Cr, Mn, Fe, Co, Ni, Ga, Nb, Mo, Ru, Ir, Ta, Ce, Pb, and La. For example, $SrTiO_3$, or any of $SrNbO_3$, $SrLaO_3$, and $SrRuO_3$ formed by substituting the Ti site of $SrTiO_3$ with Nb, Ru, and La, respectively, has a lattice constant of approximately 3.9 angstroms. This third example differs from the first and second examples in that epitaxial growth is possible in a structure formed by stacking a unit-lattice cube on a unit-lattice cube. Furthermore, the lattice mismatch with $Mn_3Ga$ is approximately 0.1%, which is extremely small.

The base layer 100 may be a multi-layer film formed with a combination of the first through third examples. For example, the base layer 100 may be $Cr/Fe/MgAl_2O_4$, $Fe/SrTiO_3$, $Cr/Fe/SrRuO_3$, $Cr/MgAl_2O_4$, $Cr/SrTiO_3$, or $Cr/SrRuO_3$.

To improve the crystallinity of the base layer 100, the base layer 100 may be a nitride layer that is (001)-oriented and contains at least one element selected from the group consisting of Ti, Zr, Nb, V, Hf, Ta, Mo, W, B, Al, Ce, and La in any of the first through third examples. Also, the base layer 100 may be an oxide layer that is (001)-oriented and contains at least one element selected from the group consisting of Mg, Zn, and Ti. Further, the base layer 100 may be a fluoride layer that is (001)-oriented and contains at least one element selected from the group consisting of Mg, Ca, and Ba. For example, the base layer 100 may be Cr/MgO or Cr/TiN.

(Magnetic Layer 8)

The magnetic layer 8 has the axis of easy magnetization in a direction perpendicular to the film surface. Materials that can be used for the magnetic layer 8 are metals that are crystal-oriented in (111) of a face-centered cubic (FCC) structure or in (001) of a hexagonal close-packed (HCP) structure, or metals that can form artificial lattices, for example.

Examples of metals that are crystal-oriented in (111) of FCC or are crystal-oriented in (001) of HCP include alloys each containing at least one element selected from the first group consisting of Fe, Co, Ni, and Cu, and at least one element selected from the second group consisting of Pt, Pd, Rh, and Au. Specifically, these examples include ferromagnetic alloys such as CoPd, CoPt, NiCo, and NiPt.

Other examples of materials that can be used for the magnetic layer 8 include structures in which a single metal formed with at least one element selected from the group consisting of Fe, Co, and Ni or an alloy (a ferromagnetic film) containing this at least one element, and a single metal formed with at least one element selected from the group consisting of Cr, Pt, Pd, Ir, Rh, Ru, Os, Re, Au, and Cu or an alloy (a nonmagnetic film) containing this at least one element are alternately stacked. Such examples include a Co/Pt artificial superlattice, a Co/Pd artificial superlattice, a CoCr/Pt artificial superlattice, a Co/Ru artificial superlattice, Co/Os, Co/Au, and a Ni/Cu artificial superlattice. Each of these artificial superlattices can control the magnetic anisotropy energy density and the saturation magnetization by adjusting the addition of an element to the ferromagnetic film and the thickness ratio between the ferromagnetic film and the nonmagnetic film.

Other examples of materials that can be used for the magnetic layer 8 include alloys each containing at least one element selected from the group consisting of Fe, Co, and Ni, and at least one element selected from the group consisting of Tb, Dy, and Gd, which are rare-earth metals. Such examples include TbFe, TbCo, TbFeCo, DyTbFeCo, and GdTbCo. Alternatively, a multi-layer structure in which these alloys are alternately stacked may be used. Specifically, examples of such multi-layer structures include multi-layer films such as TbFe/Co, TbCo/Fe, TbFeCo/CoFe, DyFe/Co, DyCo/Fe, and DyFeCo/CoFe. Each of these alloys can control the magnetic anisotropy energy density and the saturation magnetization by adjusting the thickness ratio and the composition.

Other examples of materials that can be used for the magnetic layer 8 include alloys each containing at least one element selected from the first group consisting of Fe, Co, Ni, and Cu, and at least one element selected from the second group consisting of Pt, Pd, Rh, and Au. Specifically, these examples include ferromagnetic alloys such as FeRh, FePt, FePd, and CoPt.

(Interfacial Magnetic Layer 4 and Interfacial Magnetic Layer 6)

To increase the magnetoresistance ratio of the magnetoresistive element, a material with a high spin polarizability is used for the interfacial magnetic layers adjacent to the MgO tunnel barrier layer. For example, each of the interfacial magnetic layer 4 and the interfacial magnetic layer 6 is preferably an alloy formed with at least one metal selected from the group consisting of Fe and Co. In a case where an interfacial magnetic layer formed with CoFe, a nonmagnetic layer formed with MgO, and another interfacial magnetic layer formed with CoFe are employed, for example, an epitaxial relationship expressed as CoFe(001)/MgO(001)/CoFe(001) can be established. In this case, the wavenumber selectivity for tunneling electrons can be improved, and thus, a high magnetoresistance ratio can be achieved.

If the interfacial magnetic layer 4 and the interfacial magnetic layer 6 have epitaxially grown and are (001)-oriented with respect to MgO, a high magnetoresistance ratio can be achieved. In view of this, the interfacial magnetic layer 4 and the interfacial magnetic layer 6 that are in contact with the nonmagnetic layer 5 formed with MgO may expand and contract in directions perpendicular to the film surfaces.

Also, to control the saturation magnetizations of the interfacial magnetic layer 4 and the interfacial magnetic layer 6, at least one element selected from the group consisting of Ni, B, Al, C, P, Ta, Ti, Mo, Si, W, Nb, Mn, and Ge may be added to the interfacial magnetic layer 4 and the interfacial magnetic layer 6. That is, the interfacial magnetic layer 4 and the interfacial magnetic layer 6 may be alloys each containing at least one element selected from the group consisting of Fe and Co, and at least one element selected from the group consisting of Ni, B, Al, C, P, Ta, Ti, Mo, Si, W, Nb, Mn, and Ge. Other than CoFeB, examples of such alloys include CoFeSi, CoFeP, CoFeW, CoFeNb, and CoFeAl, and these alloys each have a spin polarizability similar to that of CoFeB. Also, Heusler metals, such as $Co_2FeSi$, $Co_2MnSi$, and $Co_2MnGe$, may be used. A Heusler metal has a spin polarizability that is equal to or higher than that of CoFeB, and therefore, is suitable for an interfacial magnetic layer.

(Nonmagnetic Layer 5)

In a case where the nonmagnetic layer 5 is an insulating material, a tunnel barrier layer is used. An example of the material of the tunnel barrier layer is an oxide containing at least one element selected from the group consisting of Be, Mg, Ca, Sr, Ba, Al, Zn, and Ti. Specific examples of such oxides include MgO, AlO, ZnO, SrO, and TiO. Also, the tunnel barrier layer may be a mixed crystal material formed with two or more materials selected from the group consisting of the above oxides, or may be a stack structure formed with these materials. Examples of mixed crystal materials include MgAlO, MgZnO, MgTiO, and MgCaO. In a case where the tunnel barrier layer is a two-layer stack structure, examples of two-layer stack structures include MgO/ZnO, MgO/AlO, TiO/AlO, and MgAlO/MgO. In a case where the tunnel barrier layer is a three-layer stack structure, examples of three-layer stack structures include AlO/MgO/AlO, ZnO/MgO/ZnO, and MgAlO/MgO/MgAlO. It should be noted that the left side of the symbol "/" indicates the upper layer, and the right side of the symbol "/" indicates the lower layer.

The tunnel barrier layer may be either a crystalline material or an amorphous material. However, in a case where the tunnel barrier layer is crystallized, electron scattering in the tunnel barrier is reduced, and accordingly, the probability of electrons being selectively tunnel-conducted from the ferromagnetic layer while maintaining the wavenumber becomes higher. Thus, the magnetoresistance ratio can be made higher. To achieve a higher magnetoresistance ratio, a tunnel barrier containing a large amount of crystalline material is preferable.

(Nonmagnetic Layer 3)

In a case where the nonmagnetic layer 3 is not provided, an element of the magnetic layer 2 diffuses into the nonmagnetic layer 5, and the diffusing element is segregated between the nonmagnetic layer 5 and the interfacial magnetic layer 4, resulting in a decrease in the magnetoresistive change rate of the magnetoresistive element. For example, in a case where the magnetic layer 2 is formed with two or more elements, the composition of the magnetic layer 2 changes by the amount equivalent to the diffusing element. As a result, desired magnetic properties cannot be achieved for the magnetic layer 2, and a change in the state density leads to an alteration in the electrical conduction properties. The nonmagnetic layer 3 is adjacent to the magnetic layer 2 formed with an alloy containing Mn and at least one element selected from the group consisting of Ga, Ge, and Al, and to the interfacial magnetic layer 4 containing Fe and/or Co.

Therefore, the nonmagnetic layer 3 is preferably formed with an element that is not easily solid-solved with Mn, Ga, Ge, Al, Fe, and Co. Even if the element is solid-solved with one of these elements, the total width of the composition that can be solid-solved is preferably not greater than 15 atomic percent.

Figure 9:
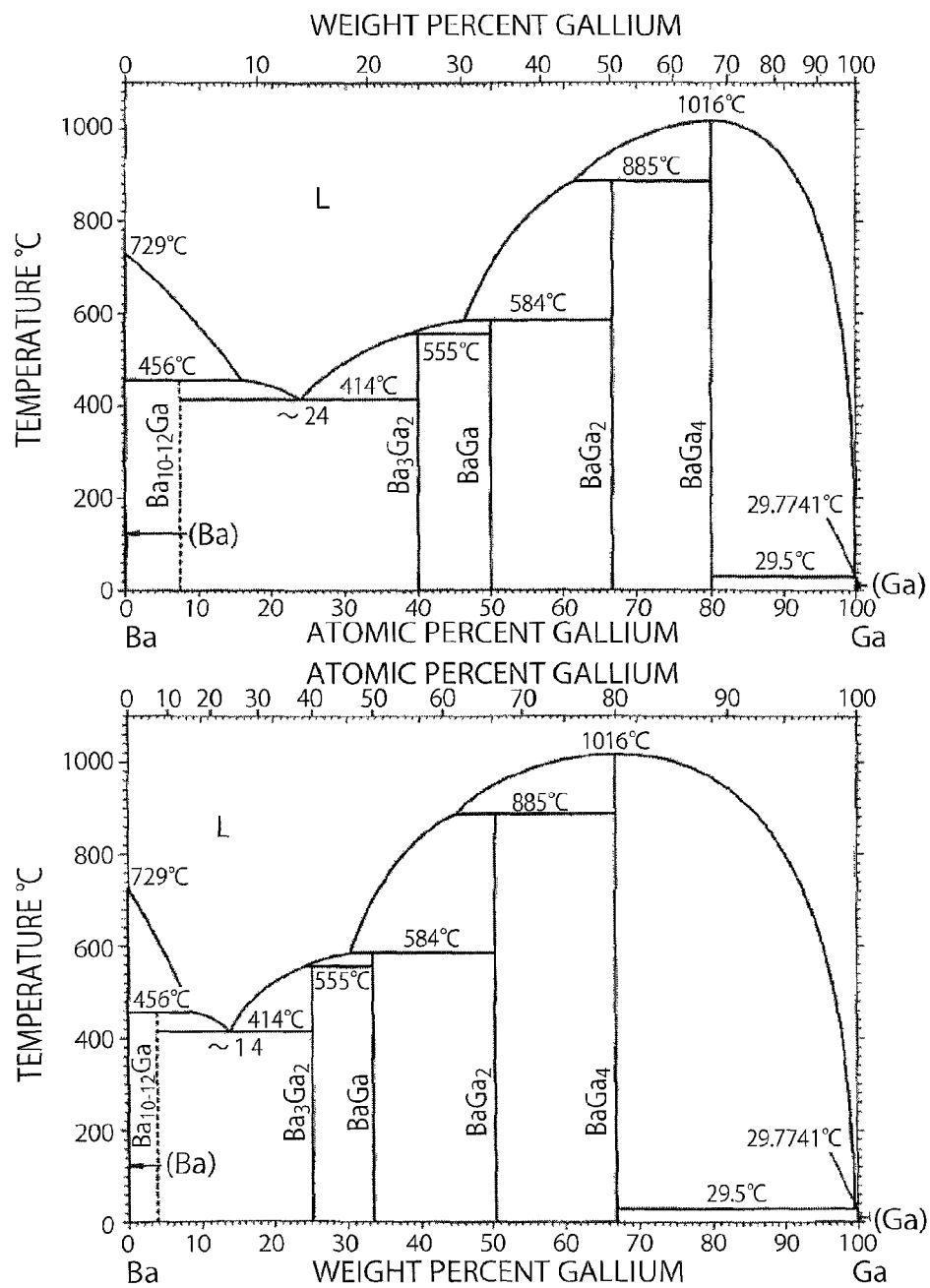
FIG. 9 shows phase diagrams of Ba and Ga.
Figure 10:
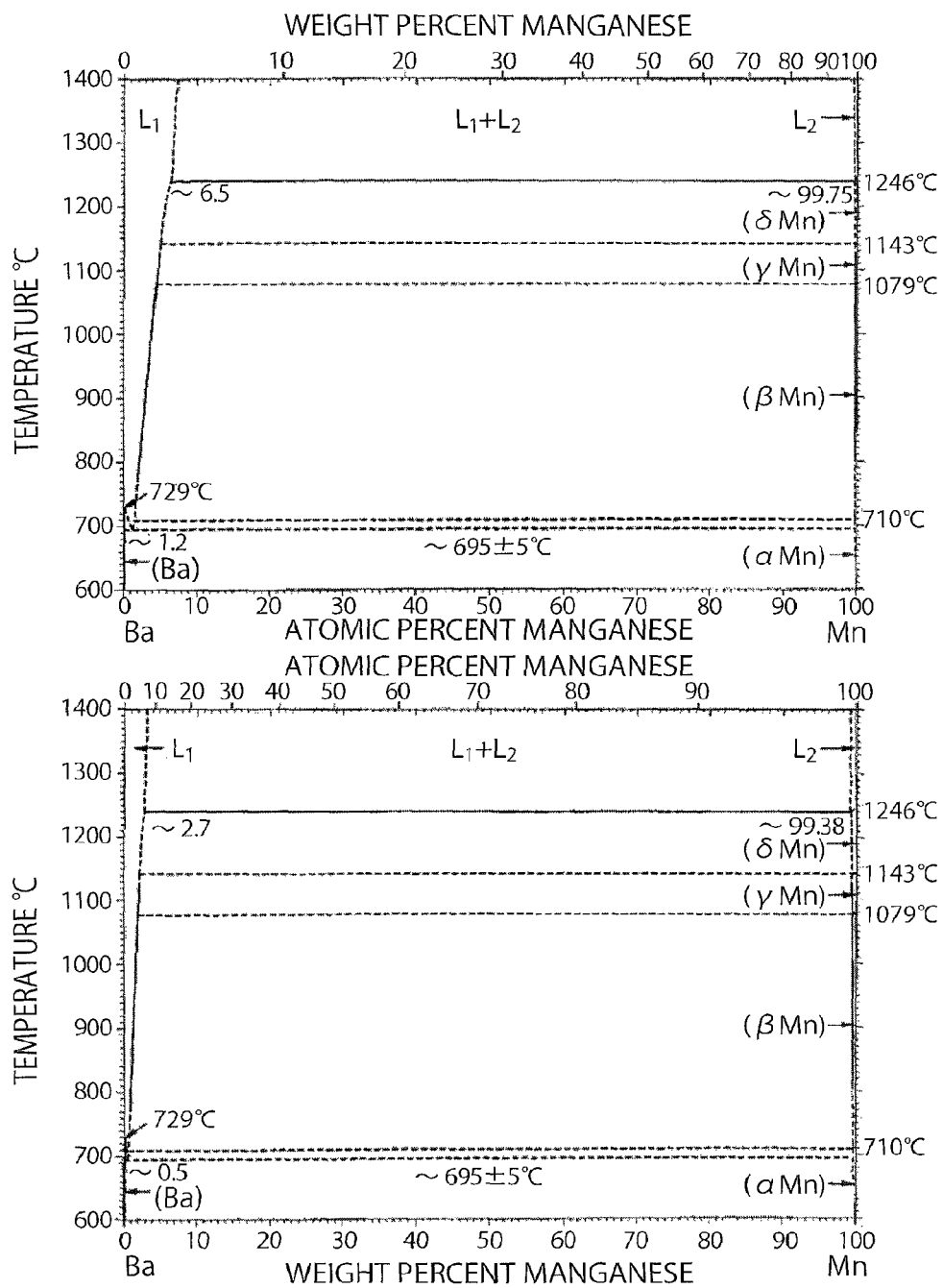
FIG. 10 shows phase diagrams of Ba and Mn.
Figure 11:
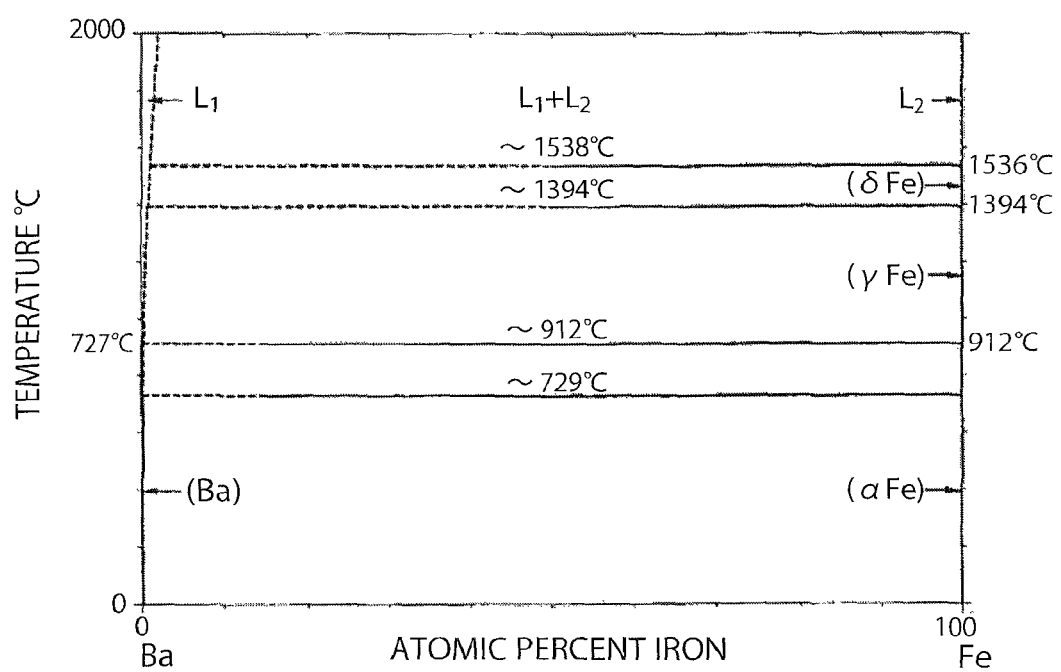
FIG. 11 shows phase diagrams of Ba and Fe.

FIG. 9 shows phase diagrams of Ba and Ga (BINARY ALLOY PHASE DIAGRAMS, VOL. 1, Ed. T. B. Massalski, 1986, p. 409). FIG. 10 shows phase diagrams of Ba and Mn (BINARY ALLOY PHASE DIAGRAMS, VOL. 1, Ed. T. B. Massalski, 1986, p. 420). FIG. 11 shows phase diagrams of Ba and Fe (BINARY ALLOY PHASE DIAGRAMS, II Ed., VOL. 1, Ed. T. B. Massalski, 1990, p. 577). As can be seen from FIG. 9, Ba is not solid-solved with Ga, and forms an intermetallic compound. This indicates that Ba and Ga are a combination of elements that are not easily solid-solved with each other. As can be seen from FIG. 10, Ba and Mn cause phase separation, and do not mix with each other. Likewise, as can be seen from FIG. 11, Ba causes phase separation, and does not mix with Fe, either.

Figure 12:
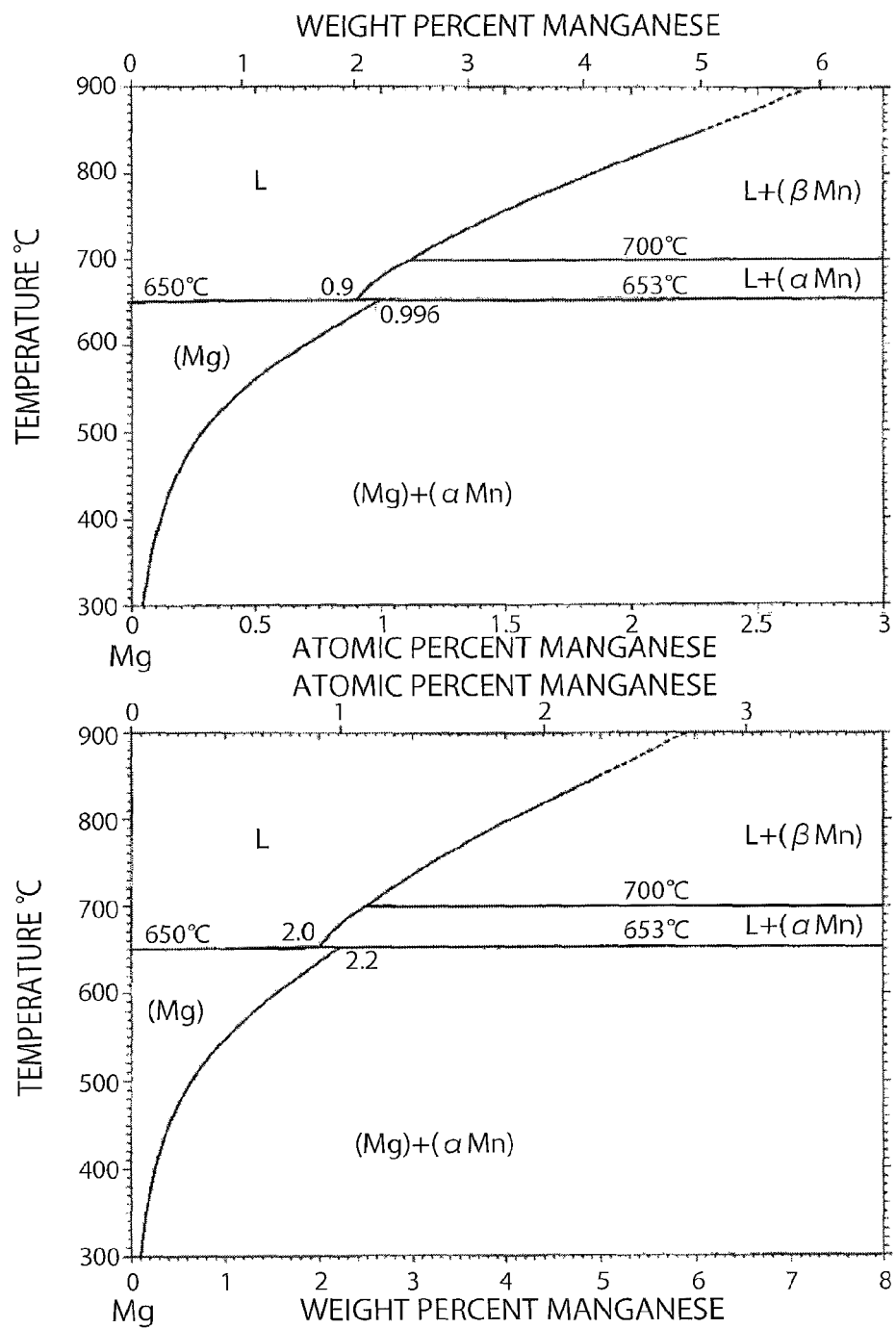
FIG. 12 shows phase diagrams of Mg and Mn.
Figure 13:
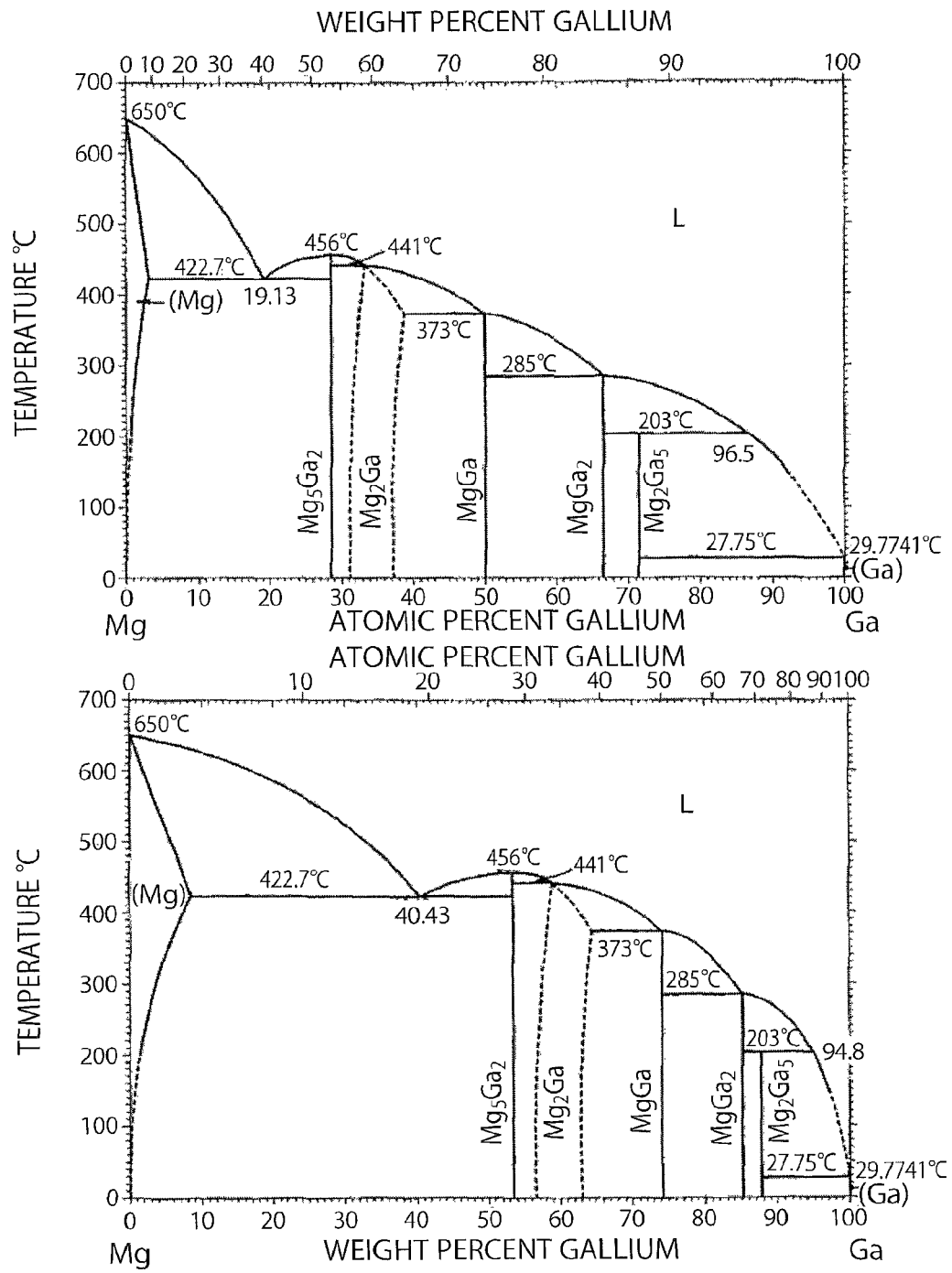
FIG. 13 shows phase diagrams of Mg and Ga.
Figure 14:
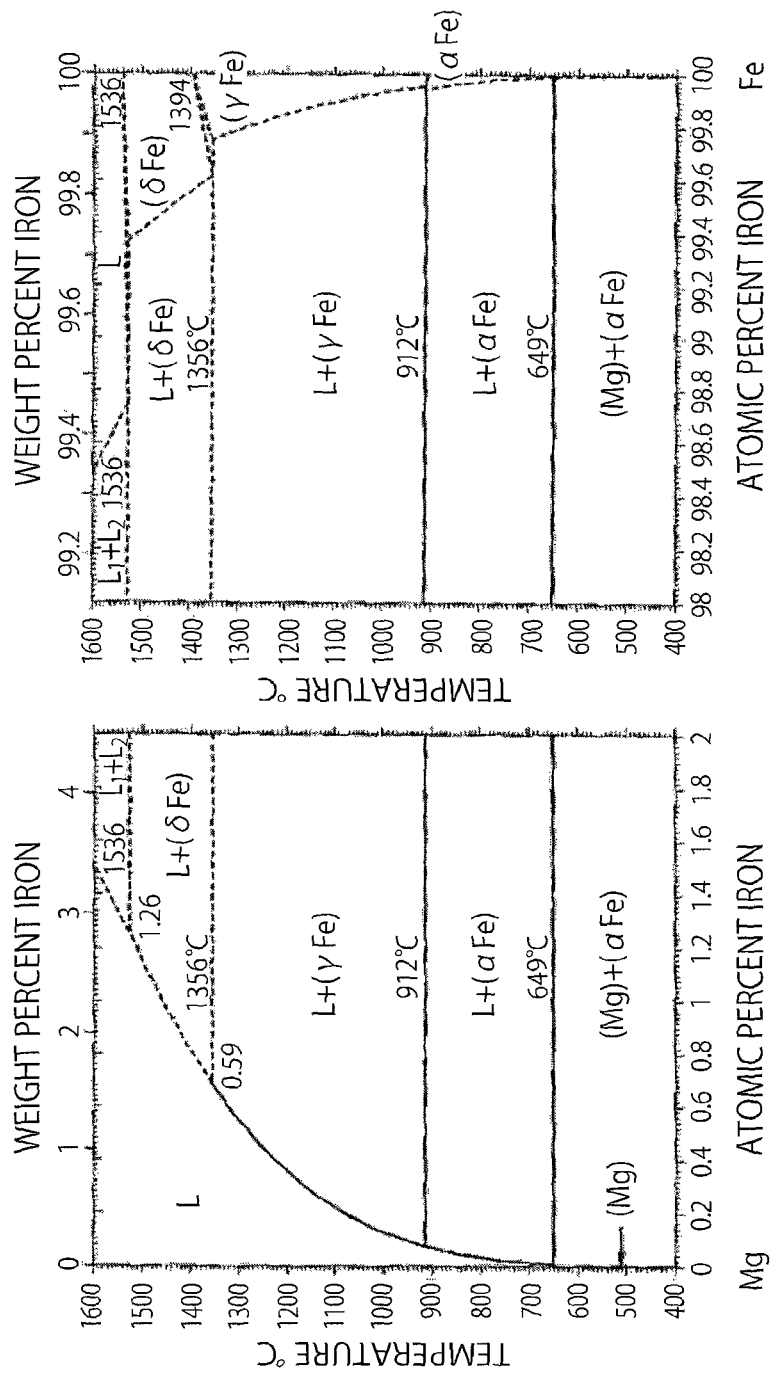
FIG. 14 shows phase diagrams of Mg and Fe.

FIG. 12 shows phase diagrams of Mg and Mn (BINARY ALLOY PHASE DIAGRAMS, VOL. 2, Ed. T. B. Massalski, 1986, p. 1523). FIG. 13 shows phase diagrams of Mg and Ga (BINARY ALLOY PHASE DIAGRAMS, VOL. 2, Ed. T. B. Massalski, 1986, p. 1143). As can be seen from FIGS. 12 and 13, Mg has an extremely narrow solid solution composition domain, which is approximately 0.1 atomic percent. As can be seen from the phase diagrams (BINARY ALLOY PHASE DIAGRAMS, VOL. 1, Ed. T. B. Massalski, 1986, p. 1076) shown in FIG. 14, Mg and Fe cause phase separation, and do not mix with each other.

In view of the above, Ba is used for the nonmagnetic layer 3, so that Ba is not solid-solved with Fe in the interfacial magnetic layer 4, and the high spin polarizability of Fe can be maintained while diffusion of Mn or Ga is effectively prevented. Other than Ba, an element that is not solid-solved with Mn, Ga, Ge, Al, Fe, and Co is preferably used. Even if the element is solid-solved, the solid solution composition range is preferably not wider than 15 atomic percent. The elements that satisfy this condition are Mg, Ca, C, Sr, Sc, Y, Gd, Tb, Dy, Ce, Ho, Yb, Er, and B. Of these elements, there are no reported examples of phase diagrams for a combination of Ba and Co, a combination of Sr and Co, and a combination of Sr and Fe. However, Mg and Ca are known to have narrow solid solution composition domains with respect to Fe and Co. Because of this, Ba and Sr, which are also alkaline-earth metals, are expected to follow the examples of Mg and Ca. There are no reported examples of phase diagrams for a combination of C and Ga. However, B is a half metal like C, and probably has similar chemical coupling characteristics. In view of this, C is expected to follow the example of B. Therefore, the nonmagnetic layer 3 is preferably an alloy containing at least one element selected from the group consisting of Mg, Ba, Ca, C, Sr, Sc, Y, Gd, Tb, Dy, Ce, Ho, Yb, Er, and B, or a boride containing the selected element, or a stack structure formed with these materials.

There are no reported examples of phase diagrams for a combination of N and Ge, either, and therefore, easiness in solid-solving between N and Ge is unclear. However, N is an element that is not easily solid-solved with the other elements Mn, Ga, Al, Fe, and Co. Therefore, as an element of the nonmagnetic layer 3, a nitride containing at least one element selected from the group consisting of Mg, Ba, Ca, C, Sr, Sc, Y, Gd, Tb, Dy, Ce, Ho, Yb, Er, and B is considered a material that is not easily solid-solved with Mn, Ga, Al, Fe, and Co. Therefore, the nonmagnetic layer 3 may be formed with a nitride containing at least one element selected from the group consisting of Mg, Ba, Ca, C, Sr, Sc, Y, Gd, Tb, Dy, Ce, Ho, Yb, Er, and B.

There are no reported examples of phase diagrams for a combination of C and Ga, either, and therefore, easiness in solid-solving between C and Ga is unclear.

However, C is an element that is not easily solid-solved with the other elements Mn, Ge, Al, Fe, and Co. Therefore, as an element of the nonmagnetic layer 3, a carbide containing at least one element selected from the group consisting of Mg, Ba, Ca, C, Sr, Sc, Y, Nb, Gd, Tb, Dy, Ce, Ho, Yb, Er, and B is considered a material that is not easily solid-solved with Mn, Ge, Al, Fe, and Co. Therefore, the nonmagnetic layer 3 may be formed with a carbide containing at least one element selected from the group consisting of Mg, Ba, Ca, C, Sr, Sc, Y, Gd, Tb, Dy, Ce, Ho, Yb, Er, and B.

Also, it is considered that Hf, Mo, W, Ti, Zr, and Nb do not have a great diffusion reducing effect on Mn, Ga, Ge, Al, Fe, and Co. However, Hf, Mo, W, Ti, Zr, and Nb are elements that do not form all proportional solid solutions with Mn, Ga, Ge, Al, Fe, and Co, and therefore, do not dissolve on the atomic level in the entire composition domain. In view of this, it is considered that HfB, HfN, MoB, MoN, WB, WC, TiN, ZrN, TiB, NbN, NbB, and the like, which have chemical coupling stabilized by combining with B, N, or C, are not easily solid-solved with Mn, Ga, Ge, Al, Fe, and Co, and can be used as the material to form the nonmagnetic layer 3.

EXAMPLES

Next, the stack structure of a perpendicular magnetization MTJ element is specifically described as an example. A stack structure was formed with the magnetoresistive films (samples) described below. The numerical values shown in the brackets after the respective layers indicate the thicknesses (designed values) of the layers at the time of film formation. After the film formation, each of the samples was subjected to vacuum annealing at an appropriate temperature and an appropriate time, so that TMR properties and magnetic properties were optimized.

Example 1

Figure 15:
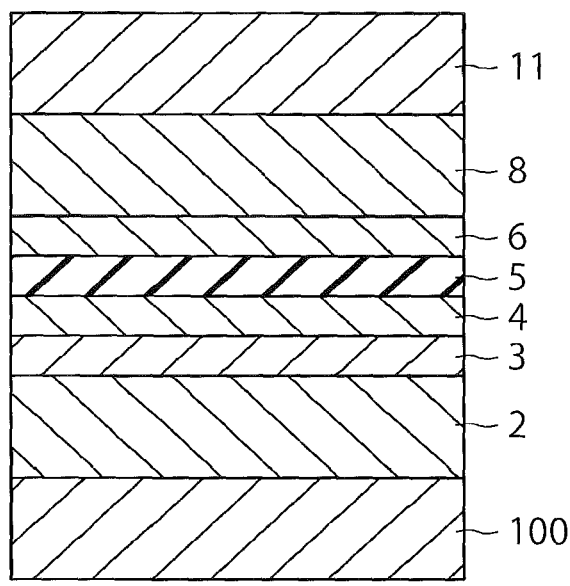
FIG. 15 is a cross-sectional view of a magnetoresistive element according to an example.

As shown in FIG. 15, an MTJ element 1 having perpendicular magnetization according to the first embodiment was formed as a perpendicular magnetization MTJ element according to this example. The MTJ element 1 according to this example has a structure in which a base layer 100, a magnetic layer 2, a nonmagnetic layer 3, an interfacial magnetic layer 4, a nonmagnetic layer 5, an interfacial magnetic layer 6, a magnetic layer 8, and a cap layer 11 are stacked in this order on an MgO single-crystal substrate (not shown). In this structure, MnGa of 30 nm in thickness was used as the magnetic layer 2, a metal containing at least one element selected from the group consisting of Cr, Ta, Pt, and Mg was used as the nonmagnetic layer 3, and FeB of 1.7 nm in thickness was used as the interfacial magnetic layer 4. FeB of 2.0 nm in thickness was used as the interfacial magnetic layer 6, and a magnetic material containing CoPt was used as the magnetic layer 8. An MgO tunnel barrier layer was used as the nonmagnetic layer 5.

Figure 16:
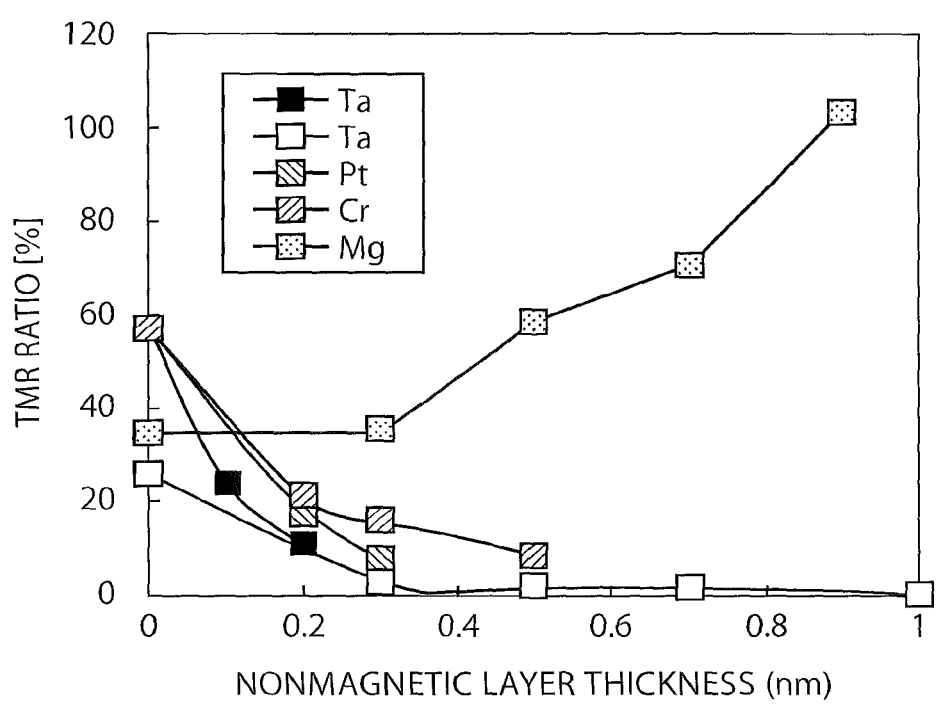
FIG. 16 is a diagram showing the dependence of the TMR ratio on the thickness of a nonmagnetic layer in the magnetoresistive element according to the example.

Perpendicular MTJ elements having nonmagnetic layers 3 of different thicknesses were manufactured, and the TMR ratios at room temperature were measured. The results are shown in FIG. 16. In the perpendicular MTJ element using Mg in the nonmagnetic layer 3, the TMR ratio became higher as the Mg thickness of the nonmagnetic layer 3 was increased. Where the Mg thickness is 0.9 nm, the TMR ratio is 104%. The solid solution composition of Mg with Mn and Ga is less than 1 atomic percent, and therefore, Mg is not easily solid-solved with Mn and Ga. In view of this, the use of Mg in the nonmagnetic layer 3 can prevent diffusion of Mn and Ga constituting the magnetic layer 2, and contributed to the increase in the TMR ratio.

Where Cr, Ta, or Pt was used in the nonmagnetic layer 3, no increase in the TMR ratio was observed in any case. Rather, the TMR ratio became lower as the thickness was increased. For example, Cr is known to be solid-solved with Mn in a wide composition domain, and the solid solution composition width of Cr is approximately 47 atomic percent.

As is apparent from the above, Cr does not have a diffusion reducing effect on Mn. Pt is solid-solved with Mn in a very wide composition range, and therefore, a diffusion reducing effect cannot be achieved with Pt. Pt and Ga also form a solid solution in a composition range of approximately 19 atomic percent. Ta and Mn are a combination of elements that do not easily form a solid solution, having a smaller solid solution width than 1 atomic percent. However, Ta and Ga form a solid solution in a composition range of approximately 18 atomic percent. That is, the total width of the composition that can form a solid solution of an element of the nonmagnetic layer 3 with at least Mn and Ga is preferably not greater than 15 atomic percent. This concept also applies to Fe, which is an element of the interfacial magnetic layer 4, and to the elements forming the nonmagnetic layer 3. If the interfacial magnetic layer 4 and the nonmagnetic layer 3 present a combination of elements that can be easily solid-solved with each other, the elements diffuse into the interfacial magnetic layer 4 due to interdiffusion of the constituent elements, and lower the spin polarizability. In view of the above, the total width of the composition that can form a solid solution of an element of the nonmagnetic layer 3 with the elements constituting the magnetic layer 2 and the interfacial magnetic layer 4 is preferably not greater than 15 atomic percent.

Fifth Embodiment

Any of the magnetoresistive elements (MTJ elements) of the first through fourth embodiments and the modifications thereof can be used in an MRAM.

A storage element in an MRAM includes a storage layer having a variable (switchable) magnetization (or spin) direction, a reference layer having an invariable (pinned) magnetization direction, and a nonmagnetic layer interposed between the storage layer and the reference layer. "The magnetization direction of the reference layer being invariable" means that the magnetization direction of the reference layer does not change when the magnetization switching current to be used for reversing the magnetization direction of the storage layer is applied between the reference layer and the storage layer of the MTJ element. One of the two magnetic layers having the axis of easy magnetization in a direction perpendicular to the film surfaces is used as the storage layer, and the other one of the two magnetic layers is used as the reference layers. In this manner, an MRAM that uses MTJ elements as storage elements can be used.

Specifically, the two magnetic layers are made to have different coercive forces, so that these magnetic layers can be used as the storage layer and the reference layer. In an MTJ element, the magnetic layer with the larger switching current is used as the one magnetic layer (reference layer), and the magnetic layer with the smaller switching current than that of the magnetic layer serving as the reference layer is used as the other magnetic layer (storage layer). In this manner, an MTJ element that includes a magnetic layer having a variable magnetization direction and a magnetic layer having an invariable magnetization direction can be obtained.

An MRAM that uses such an MTJ element as a storage element is now described as a fifth embodiment. The MRAM of the fifth embodiment is a spin-injection write MRAM.

Figure 17:
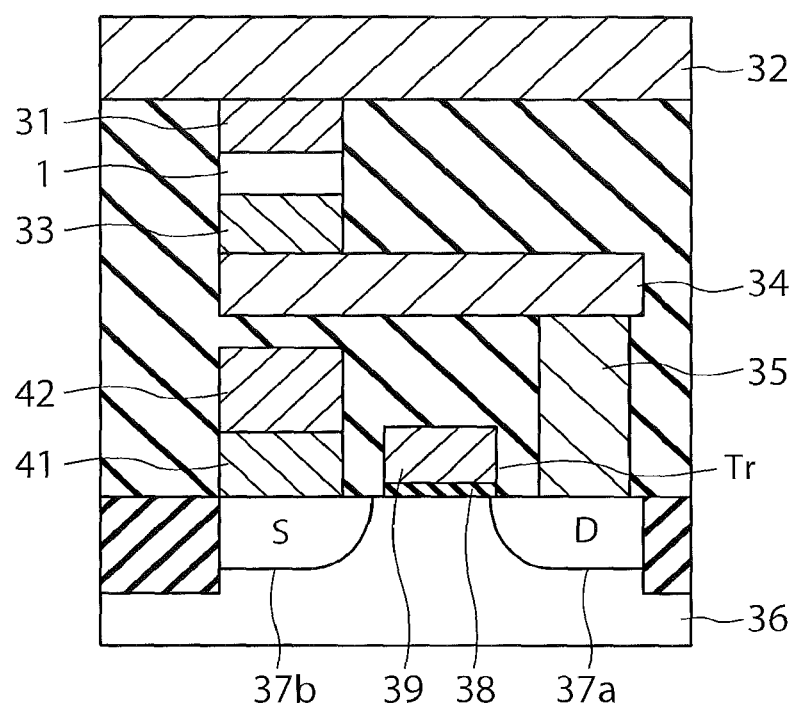
FIG. 17 is a cross-sectional view of a memory cell in a magnetic memory according to a fifth embodiment.

The MRAM of the fifth embodiment includes memory cells. FIG. 17 shows a cross-section of the relevant components of a memory cell in the MRAM of this embodiment. Each memory cell includes one of the magnetoresistive elements of the first through fourth embodiments and the modifications thereof as a storage element. In the fifth embodiment, an example case where the storage element is the MTJ element 1 of the first embodiment is described.

As shown in FIG. 17, the upper surface of the MTJ element 1 is connected to a bit line 32 via an upper electrode 31. The lower surface of the MTJ element 1 is connected to a drain region 37a of source/drain regions in a surface of a semiconductor substrate 36, via a lower electrode 33, an extraction electrode 34, and a plug 35. The drain region 37a, a source region 37b, a gate insulating film 38 formed on the substrate 36, and a gate electrode 39 formed on the gate insulating film 38 constitute a select transistor Tr. The select transistor Tr and the MTJ element 1 constitute one memory cell in the MRAM. The source region 37b is connected to another bit line 42 via a plug 41. Alternatively, the extraction electrode 34 may not be used, the plug 35 is provided under the lower electrode 33, and the lower electrode 33 and the plug 35 may be connected directly to each other. The bit lines 32 and 42, the electrodes 31 and 33, the extraction electrode 34, and the plugs 35 and 41 may be formed with W, Al, AlCu, Cu, or the like.

Figure 18:
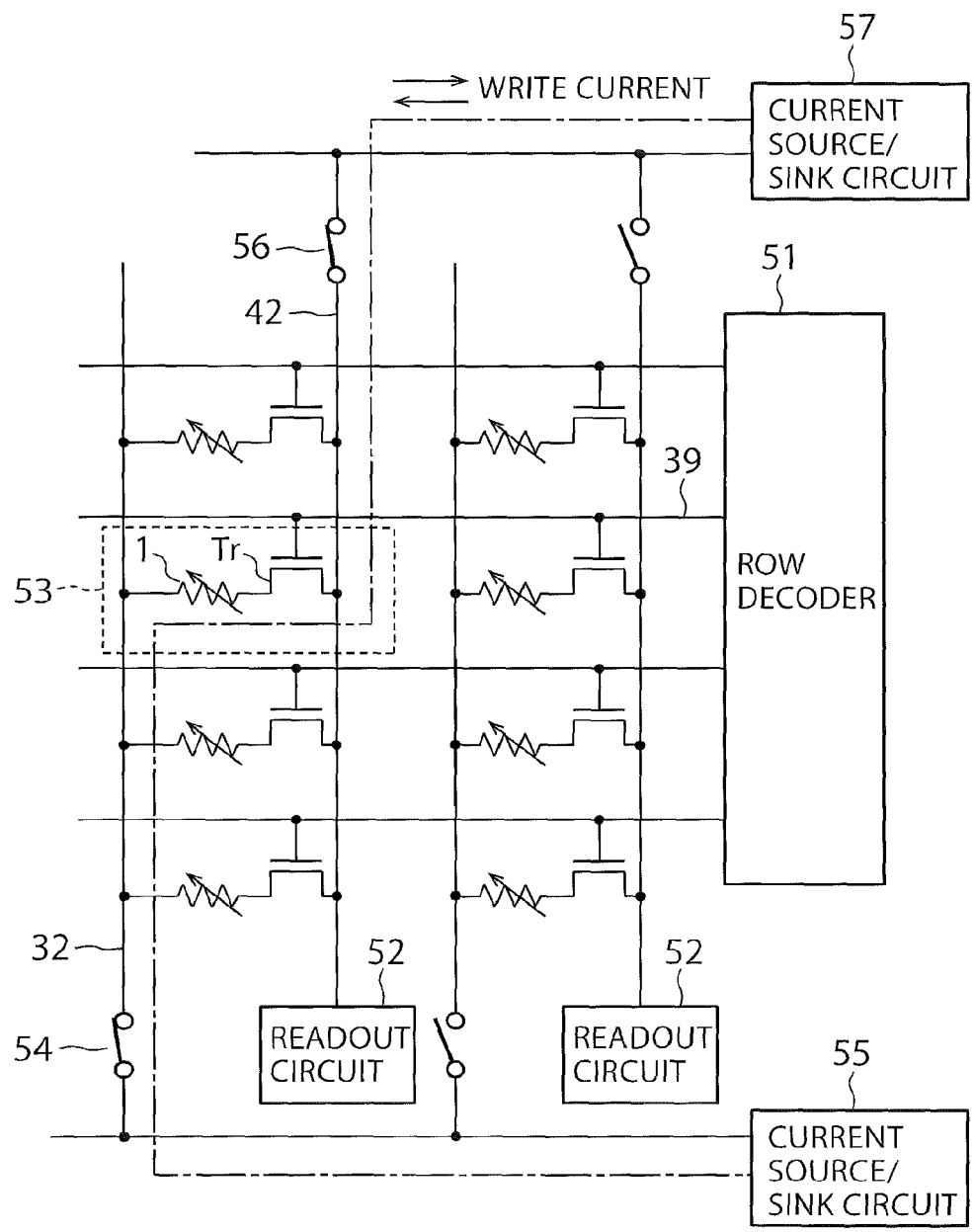
FIG. 18 is a circuit diagram showing the relevant components of the magnetic memory according to the fifth embodiment.

In the MRAM of this embodiment, the memory cells, one of which is shown in FIG. 17, are arranged in a matrix fashion, to form the memory cell array of the MRAM. FIG. 18 is a circuit diagram showing the relevant components of the MRAM of this embodiment.

As shown in FIG. 18, memory cells 53 each including the MTJ element 1 and the select transistor Tr are arranged in a matrix. One terminal of each of the memory cells 53 belonging to the same column is connected to the same bit line 32, and the other terminal is connected to the same bit line 42. The gate electrodes of the select transistors Tr of the memory cells 53 belonging to the same row are connected to one another by a word line 39, and are further connected to a row decoder 51.

The bit line 32 is connected to a current source/sink circuit 55 via a switch circuit 54 of a transistor or the like. Also, the bit line 42 is connected to a current source/sink circuit 57 via a switch circuit 56 of a transistor or the like. The current source/sink circuits 55 and 57 supply a write current to the bit lines 32 and 42 connected thereto, or pull out the write current from the bit lines 32 and 42 connected thereto.

The bit line 42 is also connected to a readout circuit 52. Alternatively, the readout circuit 52 may be connected to the bit line 32. The readout circuit 52 includes a readout current circuit and a sense amplifier.

At a time of writing, the switch circuits 54 and 56 connected to the write target memory cell, and the select transistor Tr are switched on, to form a current path via the target memory cell. In accordance with the information to be written, one of the current source/sink circuits 55 and 57 functions as the current source, and the other one of the current source/sink circuits 55 and 57 functions as the current sink. As a result, the write current flows in the direction corresponding to the information to be written.

As for the write speed, spin-injection writing can be performed with a current having a pulse width from several nanoseconds to several microseconds.

At a time of reading, a readout current that is so small as not to cause magnetization switching with the readout current circuit is supplied to the MTJ element 1 designated in the same manner as in writing. The sense amplifier of the readout circuit 52 then determines the resistance state of the MTJ element 1 by comparing the current value or the voltage value derived from the resistance value corresponding to the magnetization state of the MTJ element 1 with a reference value.

At a time of reading, the current pulse width is preferably smaller than that at a time of writing. With this, wrong writing with the readout current can be reduced. This is based on the fact that a write current with a small pulse width leads to a write current value with a large absolute value.

This embodiment can provide a magnetic memory that has a perpendicular magnetic anisotropy and is capable of achieving a greater magnetoresistive effect.

In the above described example, one of the magnetoresistive elements of the first through fourth embodiments and the modifications thereof is used in an MRAM. However, the magnetoresistive elements of the first through fourth embodiments and the modifications thereof can also be used in general other devices that utilize TMR effects.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a magnetoresistive element comprising:
a first magnetic layer comprising Mn and at least one element selected from the group consisting of Ca, Ge, and Al;
a second magnetic layer;
a first nonmagnetic layer disposed between the first magnetic layer and the second magnetic layer;
a third magnetic layer disposed between the first magnetic layer and the first nonmagnetic layer; and
a second nonmagnetic layer disposed between the first magnetic layer and the third magnetic layer, wherein the second nonmagnetic layer is in contact with the first magnetic layer and the third magnetic layer, and wherein the second nonmagnetic layer comprises an alloy layer comprising at least one element selected from the group consisting of Mg, Ba, Ca, C, Sr, Sc, Y, Gd, Tb, Dy, Ce, Ho, Yb, Er, and B;
a first wiring electrically connected to the first magnetic layer of the magnetoresistive element; and
a second wiring electrically connected to the second magnetic layer of the magnetoresistive element.

2. The memory according to claim 1, wherein the second magnetic layer comprises Mn and at least one element selected from the group consisting of Ga, Ge, and Al.

3. The memory according to claim 2, wherein:
the second magnetic layer comprises a first magnetic portion and a second magnetic portion, the first magnetic portion being disposed between the first nonmagnetic layer and the second magnetic portion; and
the first magnetic portion has a higher spin polarizability than the second magnetic portion.

4. The memory according to claim 1, further comprising:
a fourth magnetic layer disposed between the first nonmagnetic layer and the second magnetic layer; and
a third nonmagnetic layer disposed between the fourth magnetic layer and the second magnetic layer.

5. The memory according to claim 1, wherein the third magnetic layer has a higher spin polarizability than the first magnetic layer.

6. A magnetic memory, comprising:
a magnetoresistive element comprising:
a first magnetic layer comprising Mn and at least one element selected from the group consisting of Ga, Ge, and Al;
a second magnetic layer;
a first nonmagnetic layer disposed between the first magnetic layer and the second magnetic layer;
a third magnetic layer disposed between the first magnetic layer and the first nonmagnetic layer; and
a second nonmagnetic layer disposed between the first magnetic layer and the third magnetic layer, wherein the second nonmagnetic layer comprises boron and at least one element selected from the group consisting of Mg, Ba, Ca, C, Sr, Sc, Y, Gd, Tb, Dy, Ce, Ho, Yb, and Er;
a first wiring electrically connected to the first magnetic layer of the magnetoresistive element; and
a second wiring electrically connected to the second magnetic layer of the magnetoresistive element.

7. The memory according to claim 6, wherein the second magnetic layer comprises Mn and at least one element selected from the group consisting of Ga, Ge, and Al.

8. The memory according to claim 7, wherein:
the second magnetic layer comprises a first magnetic portion and a second magnetic portion, the first magnetic portion being disposed between the first nonmagnetic layer and the second magnetic portion; and
the first magnetic portion has a higher spin polarizability than the second magnetic portion.

9. The memory according to claim 6, further comprising:
a fourth magnetic layer disposed between the first nonmagnetic layer and the second magnetic layer; and
a third nonmagnetic layer disposed between the fourth magnetic layer and the second magnetic layer.

10. The memory according to claim 6, wherein the third magnetic layer has a higher spin polarizability than the first magnetic layer.

11. A magnetic memory, comprising:
a magnetoresistive element comprising:
a first magnetic layer comprising Mn and at least one element selected from the group consisting of Ga, Ge, and Al;
a second magnetic layer;
a first nonmagnetic layer disposed between the first magnetic layer and the second magnetic layer;
a third magnetic layer disposed between the first magnetic layer and the first nonmagnetic layer; and
a second nonmagnetic layer disposed between the first magnetic layer and the third magnetic layer, wherein the second nonmagnetic layer comprises nitrogen and at least one element selected from the group consisting of Mg, Ba, Ca, C, B, Sr, Sc, Y, Gd, Tb, Dy, Ce, Ho, Yb, and Er;
a first wiring electrically connected to the first magnetic layer of the magnetoresistive element; and
a second wiring electrically connected to the second magnetic layer of the magnetoresistive element.

12. The memory according to claim 11, wherein the third magnetic layer has a higher spin polarizability than the first magnetic layer.

13. A magnetic memory, comprising:
a magnetoresistive element comprising:
a first magnetic layer comprising Mn and at least one element selected from the group consisting of Ga, Ge, and Al;
a second magnetic layer;
a first nonmagnetic layer disposed between the first magnetic layer and the second magnetic layer;
a third magnetic layer disposed between the first magnetic layer and the first nonmagnetic layer; and
a second nonmagnetic layer disposed between the first magnetic layer and the third magnetic layer, wherein the second nonmagnetic layer comprises carbon and at least one element selected from the group consisting of Mg, Ba, Ca, B, Sr, Sc, Y, Gd, Tb, Dy, Ce, Ho, Yb, and Er;
a first wiring electrically connected to the first magnetic layer of the magnetoresistive element; and
a second wiring electrically connected to the second magnetic layer of the magnetoresistive element.

14. The memory according to claim 13, wherein the third magnetic layer has a higher spin polarizability than the first magnetic layer.

15. A magnetic memory, comprising:
a magnetoresistive element comprising:
a first magnetic layer comprising Mn and at least one element selected from the group consisting of Ga, Ge, and Al;
a second magnetic layer;
a first nonmagnetic layer disposed between the first magnetic layer and the second magnetic layer;
a third magnetic layer disposed between the first magnetic layer and the first nonmagnetic layer; and
a second nonmagnetic layer disposed between the first magnetic layer and the third magnetic layer, wherein the second nonmagnetic layer comprises at least one element selected from the group consisting of Mg, Ba, Ca, C, Sr, Sc, Y, Gd, Tb, Dy, Ce, Ho, Yb, Er, and B;
a first wiring electrically connected to the first magnetic layer of the magnetoresistive element; and
a second wiring electrically connected to the second magnetic layer of the magnetoresistive element,
wherein:
the second nonmagnetic layer comprises a first portion and a second portion disposed between the first portion and the third magnetic layer;
the first portion comprises at least one element selected from the group consisting of Mg, Ba, Ca, C, Sr, Sc, Y, Gd, Tb, Dy, Ce, Ho, Yb, Er, and B; and
the second portion comprises at least one element selected from the group consisting of Ta, Ti, W, Nb, V, Cr, and Hf.

16. A magnetic memory comprising: a magnetoresistive element including: a first magnetic layer comprising Mn and at least one element selected from the group consisting of Ga, Ge, and Al; a second magnetic layer; a first nonmagnetic layer disposed between the first magnetic layer and the second magnetic layer; a third magnetic layer disposed between the first magnetic layer and the first nonmagnetic layer, wherein the third magnetic layer has a higher spin polarizability than the first magnetic layer; and a second nonmagnetic layer disposed between the first magnetic layer and the third magnetic layer, wherein the second nonmagnetic layer is in contact with the first magnetic layer and the third magnetic layer, and wherein the second nonmagnetic layer comprises a metal layer comprising Mg; a first wiring electrically connected to the first magnetic layer of the magnetoresistive element; and a second wiring electrically connected to the second magnetic layer of the magnetoresistive element.

17. The memory according to claim 16, wherein the second magnetic layer comprises Mn and at least one element selected from the group consisting of Ga, Ge, and Al.

18. The memory according to claim 17, wherein:
   the second magnetic layer comprises a first magnetic portion and a second magnetic portion, the first magnetic portion being disposed between the first nonmagnetic layer and the second magnetic portion; and
   the first magnetic portion has a higher spin polarizability than the second magnetic portion.

19. The memory according to claim 16, further comprising:
   a fourth magnetic layer disposed between the first nonmagnetic layer and the second magnetic layer; and
   a third nonmagnetic layer disposed between the fourth magnetic layer and the second magnetic layer.

* * * * *